United States Patent
Nakamura et al.

(10) Patent No.: US 8,995,163 B2
(45) Date of Patent: Mar. 31, 2015

(54) MAGNETIC MEMORY

(71) Applicant: Kabushiki Kaisha Toshiba, Tokyo (JP)

(72) Inventors: Shiho Nakamura, Fujisawa (JP);
Hirofumi Morise, Yokohama (JP);
Tsuyoshi Kondo, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 13/761,637

(22) Filed: Feb. 7, 2013

(65) Prior Publication Data

US 2013/0242647 A1    Sep. 19, 2013

(30) Foreign Application Priority Data

Mar. 16, 2012    (JP) .................................. 2012-060414

(51) Int. Cl.
G11C 19/00    (2006.01)
G11C 11/16    (2006.01)
G11C 11/14    (2006.01)

(52) U.S. Cl.
CPC .............. G11C 11/161 (2013.01); G11C 11/14 (2013.01)
USPC .................. 365/80; 365/85; 365/87; 365/171; 365/173

(58) Field of Classification Search
CPC ............................... G11C 11/161; G11C 11/14
USPC .................. 365/80, 85, 87, 171, 173
See application file for complete search history.

(56) References Cited

U.S. PATENT DOCUMENTS

| | | | |
|---|---|---|---|
| 6,834,005 B1 | 12/2004 | Parkin | |
| 6,898,132 B2 | 5/2005 | Parkin | |
| 7,236,386 B2 * | 6/2007 | Parkin | 365/80 |
| 7,242,604 B2 * | 7/2007 | Klaeui et al. | 365/145 |
| 7,514,271 B2 * | 4/2009 | Gaidis et al. | 438/3 |
| 7,598,097 B2 * | 10/2009 | Chen et al. | 438/3 |
| 7,738,278 B2 * | 6/2010 | Kim et al. | 365/80 |
| 7,751,223 B2 * | 7/2010 | Kim et al. | 365/80 |
| 7,760,535 B2 * | 7/2010 | Parkin et al. | 365/81 |

(Continued)

FOREIGN PATENT DOCUMENTS

JP    2007-324269    12/2007

OTHER PUBLICATIONS

A. Yamaguchi, et al., "Real-Space Observation of Current-Driven Domain Wall Motion in Submicron Magnetic Wires", Physical Review Letters, vol. 92, No. 7, Feb. 20, 2004, 4 pages.

(Continued)

*Primary Examiner* — Viet Q Nguyen
(74) *Attorney, Agent, or Firm* — Oblon, McClelland, Maier & Neustadt, L.L.P.

(57) ABSTRACT

A magnetic memory according to an embodiment includes: a magnetic layer including a plurality of magnetic domains and a plurality of domain walls, and extending in a direction; a pinning layer formed with nonmagnetic phases and magnetic phases, extending in an extending direction of the magnetic layer and being located adjacent to the magnetic layer; an electrode layer located on the opposite side of the pinning layer from the magnetic layer; an insulating layer located between the pinning layer and the electrode layer; a current introducing unit flowing a shift current to the magnetic layer, the shift current causing the domain walls to shift; a write unit writing information into the magnetic layer; a read unit reading information from the magnetic layer; and a voltage generating unit generating a voltage to be applied between the pinning layer and the electrode layer.

13 Claims, 20 Drawing Sheets

(56) References Cited

U.S. PATENT DOCUMENTS

| | | | |
|---|---|---|---|
| 7,817,461 B2 * | 10/2010 | Lee et al. | 365/158 |
| 7,835,167 B2 * | 11/2010 | Lim et al. | 365/80 |
| 7,855,908 B2 * | 12/2010 | Joe et al. | 365/85 |
| 7,872,896 B2 * | 1/2011 | Hung | 365/80 |
| 7,952,906 B2 * | 5/2011 | Lim | 365/81 |
| 7,957,175 B2 * | 6/2011 | Lim et al. | 365/81 |
| 7,986,493 B2 * | 7/2011 | Weller et al. | 360/135 |
| 8,102,691 B2 * | 1/2012 | Xi et al. | 365/81 |
| 8,125,814 B2 * | 2/2012 | Tsai | 365/80 |
| 8,164,940 B2 * | 4/2012 | Ozatay et al. | 365/130 |
| 8,331,125 B2 * | 12/2012 | DeBrosse | 365/80 |
| 8,467,222 B2 * | 6/2013 | Shen et al. | 365/80 |
| 8,741,664 B2 * | 6/2014 | Annunziata et al. | 438/3 |
| 8,743,584 B2 * | 6/2014 | Fukuzumi et al. | 365/80 |
| 8,772,889 B2 * | 7/2014 | Gaidis et al. | 257/421 |
| 2010/0225312 A1 | 9/2010 | Nakamura et al. | |
| 2013/0168786 A1 * | 7/2013 | Shen | 257/421 |

OTHER PUBLICATIONS

Stuart S. P. Parkin, "Data in the Fast Lanes of Racetrack Memory", Scientific American, Inc., Jun. 2009, 6 pages.

Office Action issued Jun. 17, 2014, in Japanese Patent Application No. 2012-060414 with English translation.

\* cited by examiner

MAGNETIC MEMORY

CROSS-REFERENCE TO RELATED APPLICATION

This application is based upon and claims the benefit of priority from prior Japanese Patent Application No. 2012-60414 filed on Mar. 16, 2012 in Japan, the entire contents of which are incorporated herein by reference.

FIELD

Embodiments described herein relate generally to magnetic memories each having a magnetic nanowire in which information is recorded in each of magnetic domains separated from one another by domain walls.

BACKGROUND

In recent years, there have been reports that domain wall shifts by current were observed in magnetic nanowires with submicron widths. Magnetic memories that can cause domain walls to shift by taking advantage of the reported effect have been suggested. In such a magnetic memory, a magnetic nanowire divided into plural magnetic domains is used, and information (data) "0" or "1" is associated with the magnetization directions of the magnetic domains. In this manner, information is stored. When a current is flowed, the domain walls shift, and accordingly, the magnetic domains shift. As a result, the information (data) stored in the magnetic domains also shifts, and can be read by a sensor and be written by a write unit. That is, the magnetic domains are equivalent to memory cells. In general, there is an increasing demand for magnetic memories that have larger capacities through increases in cell density or the like, and consume less power.

In a magnetic memory of the above described domain wall shifting type, a pinning site for pinning the domain walls is necessary to prevent changes in the locations of the domain walls due to external disturbance such as heat. As a specific example, a method of forming a physical notch in a magnetic nanowire has been suggested. Also, a method of forming a domain wall pinning site by ion beam irradiation has been suggested.

DETAILED DESCRIPTION

A magnetic memory according to an embodiment includes: a magnetic layer including a plurality of magnetic domains and a plurality of domain walls separating the magnetic domains from one another, the magnetic layer extending in a direction; a pinning layer formed with nonmagnetic phases and magnetic phases, the pinning layer extending in an extending direction of the magnetic layer and being located adjacent to the magnetic layer; an electrode layer located on the opposite side of the pinning layer from the magnetic layer; an insulating layer located between the pinning layer and the electrode layer; a current introducing unit configured to flow a shift current to the magnetic layer, the shift current causing the domain walls to shift; a write unit configured to write information into the magnetic layer; a read unit configured to read information from the magnetic layer; and a voltage generating unit configured to generate a voltage to be applied between the pinning layer and the electrode layer.

The following is a detailed description of embodiments, with reference to the accompanying drawings.

First Embodiment

Figure 1:
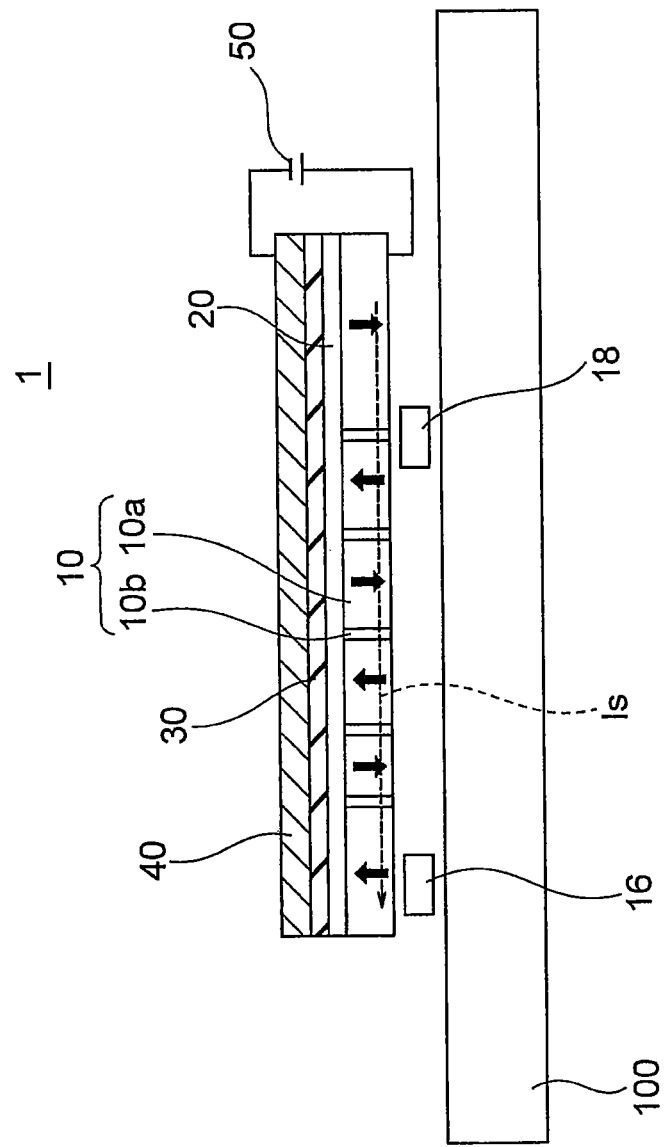
FIG. 1 is a cross-sectional view of a magnetic memory according to a first embodiment.

FIG. 1 shows the structure of a magnetic memory of a domain wall shifting type according to a first embodiment. The magnetic memory 1 of the first embodiment includes: a magnetic nanowire 10 that functions as a memory element located above a substrate 100 having an integrated circuit (not shown) mounted thereon; a write unit 16 for writing magnetic information into this magnetic nanowire 10; and a read unit 18 for reading magnetic information. A pinning layer 20 for pinning domain walls is located adjacent to the surface of the magnetic nanowire 10 on the opposite side from the substrate 100. It should be noted that a magnetic nanowire means a magnetic layer that extends in one direction. An electrode layer 40 extending in the extending direction (the longitudinal direction) of the magnetic nanowire 10 is provided on the opposite side of the pinning layer 20 from the magnetic nanowire 10, and an insulating layer 30 is provided between the magnetic nanowire 10 and the electrode layer 40. Accordingly, the pinning layer 20, the insulating layer 30, and the electrode layer 40 are provided in the extending direction of the magnetic nanowire 10. Also, a voltage generating unit 50 that generates a voltage between the magnetic nanowire 10 and the electrode layer 40, and applies an electric field to the pinning layer 20 is provided. The magnetic memory 1 of this embodiment is provided on a substrate having an integrated circuit formed thereon, but may not be provided on a substrate.

The magnetization of the magnetic nanowire 10 has an easy axis of magnetization in a direction perpendicular to the plane formed by the longitudinal direction of the magnetic nanowire 10 and the long side of a cross-section perpendicular to the longitudinal direction of the magnetic nanowire 10 (perpendicular magnetic anisotropy). In a case where the cross-section of the magnetic nanowire 10 is square in shape, the long side thereof is any side of the square shape. In the magnetic nanowire 10, magnetic domains 10a and domain walls 10b separating those magnetic domains 10a are formed, and the directions of the magnetic moments of the magnetic domains 10a are associated with data "1" or "0", to record information. The cross-section of the magnetic nanowire 10 is rectangular, square, elliptical, or circular in shape, for example. The thickness of the magnetic nanowire 10 shown in FIG. 1 is uniform in the longitudinal direction, but can cyclically vary. A shift current Is is flowed to the magnetic nanowire 10 from a current source via current introducing portions (not shown), so that the locations of the domain walls 10b are made to shift, and data are moved in the magnetic nanowire 10.

The pinning layer 20 provided adjacent to the magnetic nanowire 10 is formed with two types of phases existing in the plane of the pinning layer 20. The two types of phases are a magnetic phase region and a nonmagnetic phase region. Examples of two-phase structures of pinning layers 20 are shown in FIGS. 2(a) through 2(e). FIGS. 2(a) through 2(e) are schematic views of the respective pinning layers 20 viewed from above.

Figure 2:
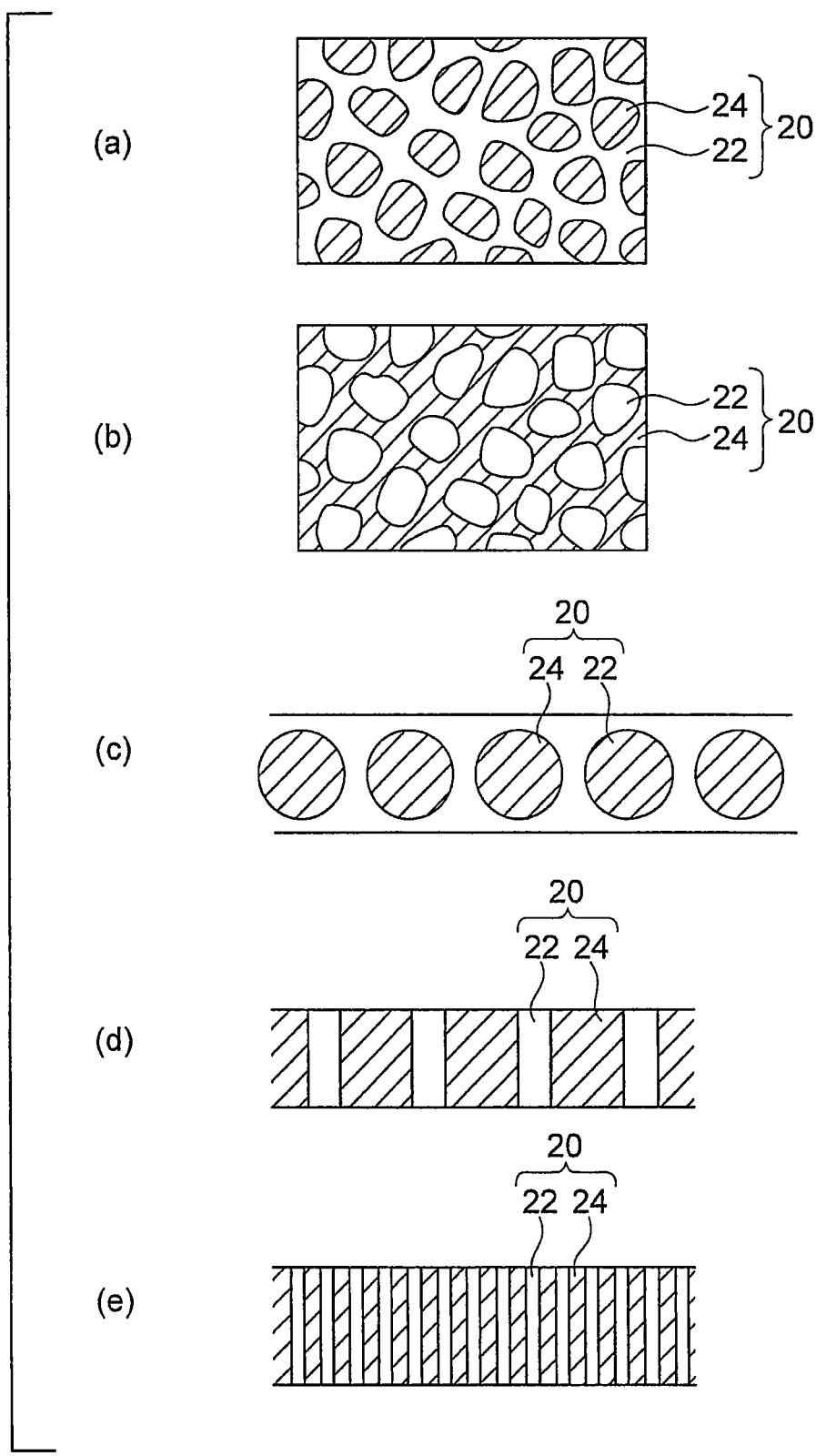
FIGS. 2(a) through 2(e) are schematic views illustrating forms of pinning layers.

A first form of a pinning layer 20 has a structure in which magnetic phases 24 are precipitated in a granular state in a nonmagnetic phase matrix 22, as shown in FIG. 2(a). This structure can be a material such as CoCrPt—SiO$_2$. CoCrPt—SiO$_2$ is a material that can be separated into two phases even if formed by co-sputtering or the like. Further, in the structure illustrated in FIG. 2(a), magnetic phases of a FePt alloy or the like can be formed like islands in a nonmagnetic phase formed with vacuum. Alternatively, the islands of FePt can be surrounded by a MgO nonmagnetic phase. As shown in FIG. 2(b), a granular form can also be realized where nonmagnetic phases 22 are precipitated in the magnetic phase matrix 24, which is the opposite of the example illustrated in FIG. 2(a). This granular form can also achieve a pinning effect.

A second form of a pinning layer 20 is formed with dot-like magnetic phases 24 and a nonmagnetic phase 22 surrounding the dots, as shown in FIG. 2(c). As will be described later in Example 2, this pinning layer 20 can be formed by using a directed self-assembly (DSA) of diblock copolymer or the like. The dot pitch (dot diameter+interval between dots) preferably corresponds to the size of one record bit, because controlling memory operations would become easier. To achieve stable bit shifts, the dot diameter is preferably equal to each of the intervals between the dots, or the dot diameter is preferably larger than each of the intervals between the dots.

In a third form of a pinning layer 20, magnetic phases 24 and nonmagnetic phases 22 are arranged in a striped form, as shown in FIGS. 2(d) and 2(e). This structure can be formed by using a technique such as DSA, as well as a top-down method such as EB lithography. The pitch of stripes (=the width of one stripe of the magnetic phases 24+the width of one stripe of the nonmagnetic phases 22) is preferably equal to the size of one bit (one magnetic domain) (FIG. 2(d)), because controlling memory operations would become easier. Alternatively, the pitch of stripes is made smaller than the size of one bit so that two or more stripes of the magnetic phases 24 correspond to one bit (FIG. 2(e)). This is preferable, because precise stripe location control would become unnecessary. In a case where the pitch of stripes is made equal to the size of one bit, the width of each stripe of the magnetic phases 24 is preferably equal to or smaller than the width of each stripe of the nonmagnetic phases 22, so as to achieve more stable bit shifts.

Next, the material of the magnetic nanowire 10, and the materials of the magnetic phase(s) 24 and the nonmagnetic phase(s) 22 of the pinning layer 20 are described.

The magnetic nanowire 10 and the magnetic phase(s) 24 of the pinning layer 20 can be formed with (1) a disordered alloy, (2) an ordered alloy, or (3) a ferrimagnetic material, for example.

Disordered Alloy

The disordered alloy can be a metal or an alloy containing at least one element selected from Fe, Co, and Ni. Examples of such disordered alloys include a NiFe alloy, a NiFeCo alloy, a CoFeB alloy, a CoCr alloy, a CoPt alloy, a CoCrTa alloy, a CoCrPt alloy, a CoCrPtTa alloy, and a CoCrNb alloy. Since those alloys have disordered structures or amorphous structures, manufacturing becomes easier, and magnetic anisotropy energy and saturation magnetization can be controlled by adjusting the proportions of the elements.

Ordered Alloy

The ordered alloy can be an alloy formed with at least one element selected from Fe, Co, and Ni, and at least one element selected from Pt and Pd. Examples of such ordered alloys having $L_{10}$ crystalline structures include $Co_{50}Pd_{50}$, $Co_{50}Pt_{50}$, $Fe_{50}Pt_{50}$, $Fe_{50}Pd_{50}$, $Fe_{30}Ni_{20}Pd_{50}$, $Co_{30}Fe_{10}Ni_{10}Pt_{50}$, and $Co_{30}Ni_{20}Pt_{50}$. Those ordered alloys are not limited by the above composition ratios. Magnetic anisotropy energy and saturation magnetization can be adjusted by adding an impurity element such as Cu, Cr, or Ag to those ordered alloys. In this manner, large magnetic anisotropy energy can be easily achieved.

Ferrimagnetic Material

The ferrimagnetic material can be an alloy of a rare-earth metal and a transition metal. Examples of such ferrimagnetic materials include an amorphous alloy formed with at least one element selected from Tb (terbium), Dy (dysprosium), and Gd (gadolinium), and at least one element selected from transition metals such as Fe, Co, and Ni. More specific examples include TbFe, TbCo, TbFeCo, DyTbFeCo, GdTbCo, and GdFeCo. Magnetic anisotropy energy and saturation magnetization can be controlled by adjusting the compositions of those alloys. Those amorphous alloys can contain fine crystals. As the material of the magnetic nanowire 10, a ferrimagnetic material that can achieve low saturation magnetization is preferable. As saturation magnetization is made lower, the current amount required for domain wall shifts can be made smaller.

A combination of the materials (1) through (3), or a combination such as TbFeCo/NiFe or GdFeCo/CoFeB, can be used as the magnetic nanowire 10, to adjust the domain wall characteristics. Also, it is possible to use a stack of ferrimagnetic layers with different compositions. Lower apparent saturation magnetization can be achieved by stacking a rare-earth-rich amorphous alloy of a rare-earth metal and a transition metal, and a transition-metal-rich amorphous alloy of a rare-earth metal and a transition metal. Accordingly, such a film stack is used as the material of the magnetic nanowire 10, to reduce the current amount required for shifting the domain walls 10b.

The material of the magnetic nanowire 10 and the material of the magnetic phase(s) 24 of the pinning layer 20 do not need to be different from each other, and should be chosen in accordance with desired design details. The material of the magnetic nanowire 10 can be the same as the material of the magnetic phase(s) 24 of the pinning layer 20.

Other than the above described conductive magnetic phase(s), an oxide containing a 3d transition metal serving as a semiconductor or an insulator can be used as the magnetic phase(s) 24 of the pinning layer 20.

As the nonmagnetic phase(s) 22 of the pinning layer 20, nonmagnetic metal phase(s) and/or nonmagnetic insulating phase(s) can be used. Examples of such nonmagnetic metal phases include Pt, Au, Ag, Cu, Al, or an alloy containing at least one of those elements. Examples of nonmagnetic insulating phases include insulating materials such as aluminum oxide (AlOx), aluminum nitride (AlN), magnesium oxide (MgO), magnesium nitride (Mg—N), silicon oxide ($SiO_2$), silicon nitride (Si—N), silicon oxynitride (Si—O—N), $TiO_2$, and $Cr_2O_3$. Other than those, it is possible to use a dielectric material such as barium titanate ($BaTiO_3$), $SrTiO_3$, $PbTiO_3$, or $HfO_2$.

With such a pinning layer 20 located adjacent to the magnetic nanowire 10, the potential of the domain walls 10b is lower in a case where the domain walls 10b are in contact with the nonmagnetic phase(s) 22 than in a case where the domain walls 10b are in contact with the magnetic phase(s) 24 as described later. As a result, the domain walls 10b are pinned to the regions where the nonmagnetic phase(s) 22 exist, as shown in the schematic views in FIGS. 3(a) through 3(c).

Figure 3:
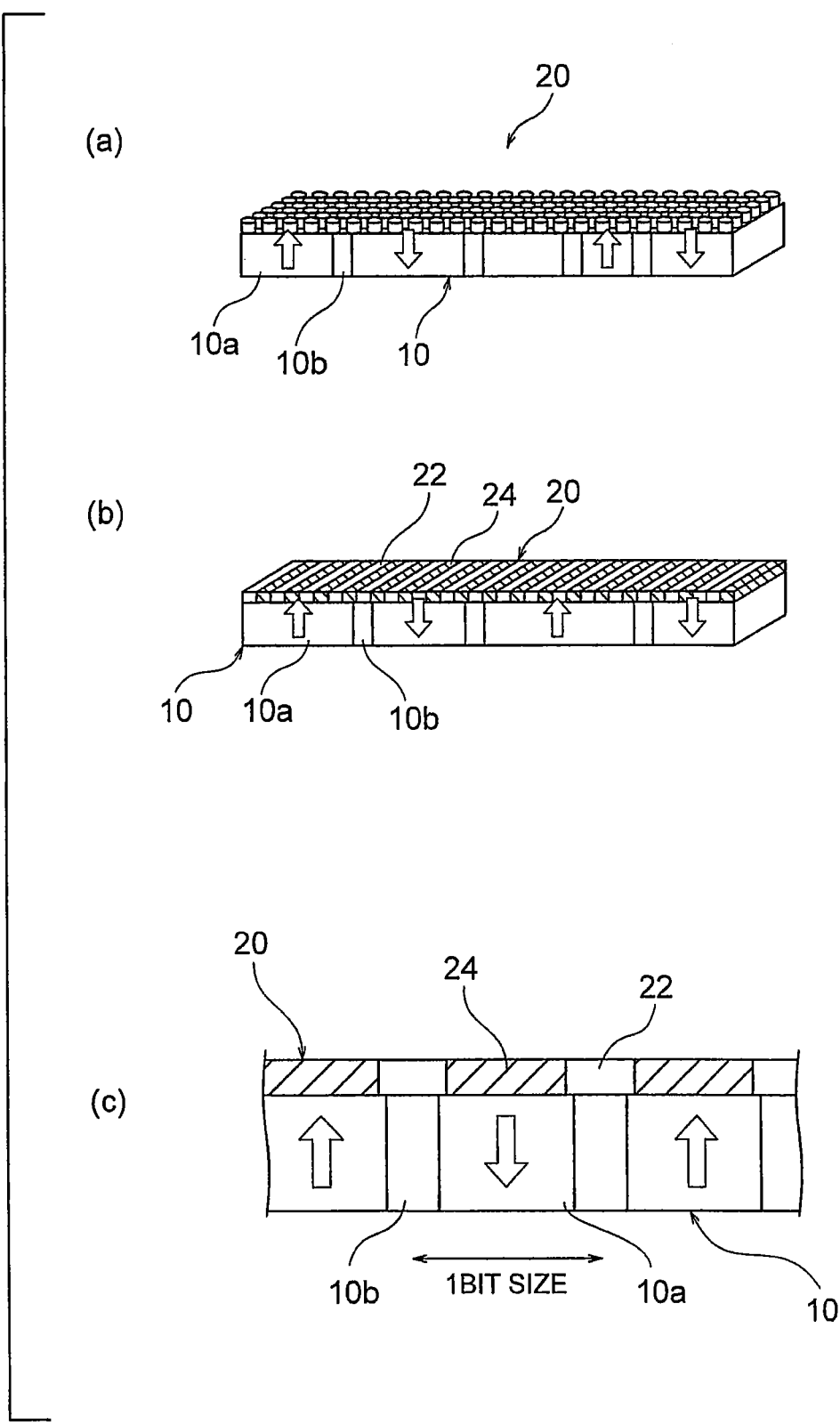
FIGS. 3(a) through 3(c) are diagrams for explaining the relationship between the domain walls of the magnetic nanowire and the pinning layer.

FIG. 3(a) shows an example in which a pinning layer having the structure illustrated in FIG. 2(a) or 2(b) is used as the pinning layer 20. The fine particle size of the granular magnetic phases or nonmagnetic phases is in the range of subnanometers to tens of nanometers. Two or more fine particles of the magnetic phases or the nonmagnetic phases correspond to one record bit. The thickness of the pinning layer 20 is greater than 0 but not greater than 10 nm.

FIG. 3(b) shows an example in which a pinning layer having the structure illustrated in FIG. 2(e) is used as the pinning layer 20. The thickness of the pinning layer 20 is greater than 0 but not greater than 10 nm. The length of one bit (the distance between adjacent domain walls) is equal to a length two or more times greater than the distance between adjacent nonmagnetic phases 22 sandwiching one magnetic phase 24 in the pinning layer 20. In FIG. 3(b), the pinning layer 20 is formed with stripes of the magnetic phases 24 and the nonmagnetic phases 22 arranged at intervals of several nanometers.

FIG. 3(c) shows an example in which a pinning layer having the structure illustrated in FIG. 2(d) is used as the pinning layer 20. The pinning layer 20 is formed with stripes of the magnetic phases 24 and the nonmagnetic phases 22 each having a length of tens of nanometers. The length of one bit (the distance between adjacent domain walls) is equal to the distance between adjacent nonmagnetic phases 22 sandwiching one magnetic phase 24 in the pinning layer 20. The thickness of the pinning layer 20 is greater than 0 but not greater than 10 nm.

The insulating layer 30 is located adjacent to the pinning layer 20. The insulating layer 30 can be formed with an insulating material such as aluminum oxide (AlOx), aluminum nitride (AlN), magnesium oxide (MgO), magnesium nitride (Mg—N), silicon oxide ($SiO_2$), silicon nitride (Si—N), silicon oxynitride (Si—O—N), $TiO_2$, or $Cr_2O_3$, or a dielectric material such as barium titanate ($BaTiO_3$), $SrTiO_3$, $PbTiO_3$, or $HfO_2$.

(Domain Wall Shift Operation)

Next, a domain wall shift operation in the magnetic nanowire 10 is described.

Figure 4:
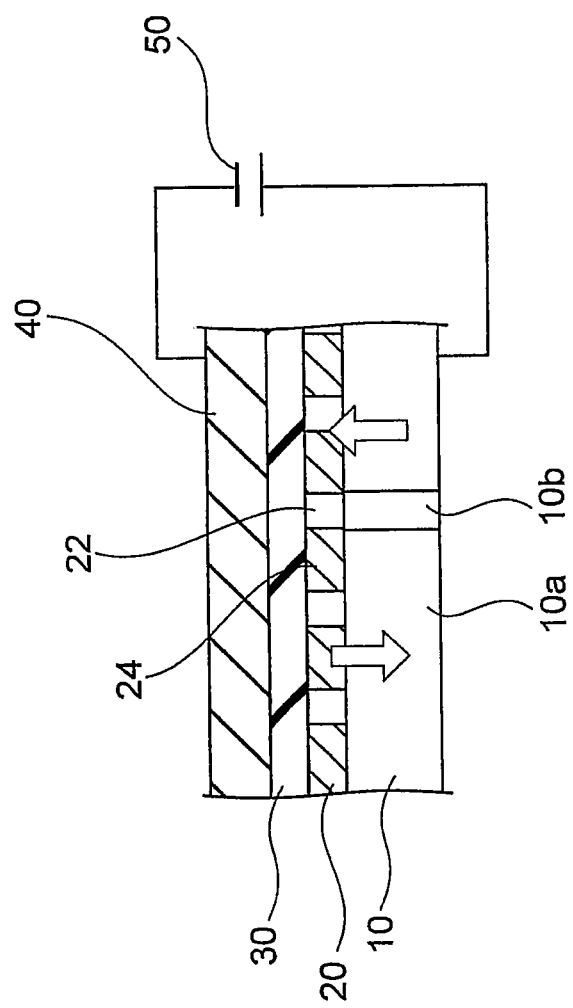
FIG. 4 is a diagram for explaining application of an electric field to the pinning layer.

As shown in FIG. 4, when an electric field is applied to the pinning layer 20 via the insulating layer 30, changes are caused in magnetic characteristics of the magnetic phases 24 of the pinning layer 20, such as the magnitude of the magnetic anisotropy, the direction of the magnetic anisotropy, or the intensity of the magnetization. Such changes are due to a magnetostrictive effect of the pinning layer 20 or the electric field effect of the surface of the pinning layer 20. If a material with high dielectric properties is used as the insulating layer 30, a particularly advantageous effect can be achieved. If the insulating layer 30 has high dielectric properties, the lattice is distorted by the electric field. Therefore, the magnetic phases 24 of the pinning layer 20 adjacent to the insulating layer 30 have the size or direction of the magnetic anisotropy changed by the magnetostrictive effect. Also, since an effective electric field can be made larger by enhancing the dielectric properties, the electric field effect of the surface of the pinning layer 20 easily develops.

Figure 5:
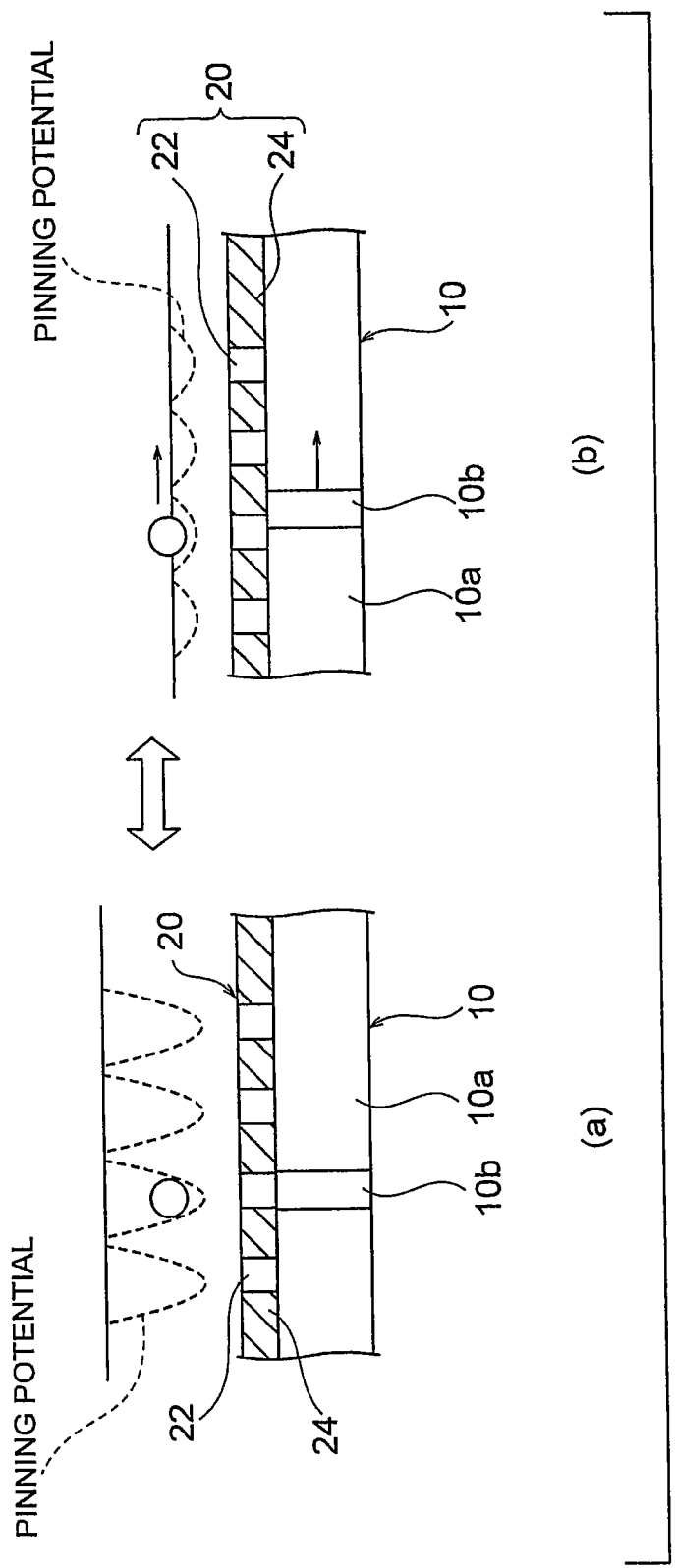
FIGS. 5(a) and 5(b) are diagrams for explaining pinning potential control.

If the magnetic anisotropy of the pinning layer 20 becomes lower due to the electric field, for example, the difference between the domain wall potential obtained in a case where the domain walls 10b of the magnetic nanowire 10 are in contact with the nonmagnetic phases 22 and the domain wall potential obtained in a case where the domain walls 10b exist in contact with the magnetic phases 24 becomes smaller. As a result, the force pinning the domain walls 10b becomes smaller, and accordingly, the domain walls 10b starts moving easily. FIGS. 5(a) and 5(b) schematically show the principle. In a case where no voltage is applied between the magnetic nanowire 10 and the electrode layer 40, the pinning force acts effectively, and the domain walls 10b are pinned to the regions of the nonmagnetic phases 22 of the pinning layer 20 (FIG. 5(a)). When a voltage is applied between the magnetic nanowire 10 and the electrode layer 40, on the other hand, an electric field is applied to the magnetic phases 24 of the pinning layer 20, and the magnetization states of the magnetic phases 24 change, to reduce the pinning force. As a result, shifting of the domain walls 10b becomes easier (FIG. 5(b)). The polarity of the voltage applied to the pinning layer 20 is decided depending on the materials constituting the pinning layer 20.

Thus, the current amount required for a shift operation can be reduced by performing a shift operation on the domain walls 10b while applying a voltage between the magnetic nanowire 10 and the electrode layer 40.

The thickness of the pinning layer 20 is preferably not greater than 10 nm. If the pinning layer 20 is thicker than that, a sufficient electric field effect cannot be achieved. Also, if the pinning layer 20 is thicker than the above, the current flow is hindered by the pinning layer, and the current value during a shift operation becomes larger. In a case where changes in the electronic state of the surface of the pinning layer 20 caused by an electric field are utilized, the thickness of the pinning layer 20 is preferably not greater than 5 nm.

Figure 6:
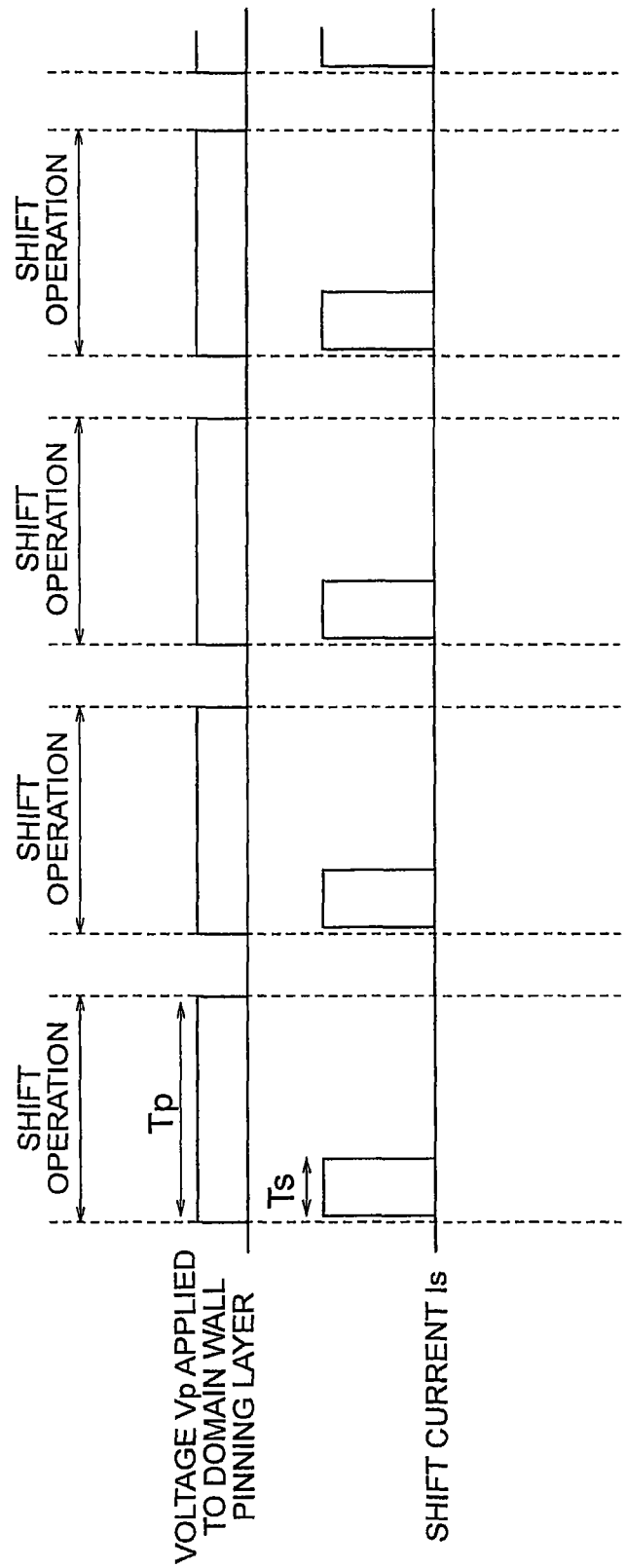
FIG. 6 is a diagram showing an example timing chart of a shift operation.

FIG. 6 is an example timing chart illustrating a shift operation performed on the domain walls 10b. The timing to apply the current (the shift current) Is to the magnetic nanowire 10 so as to move the domain walls 10b is when an electric field is being applied to the pinning layer 20. That is, the shift current Is is flowed at the same time as or after application of a voltage Vp to the pinning layer 20. It is preferable to cut off the voltage Vp after cutting off the shift current Is. To reduce the domain wall shift current, the duration Ts during which the current Is is flowed to the magnetic nanowire 10 is preferably equal to or shorter than the duration Tp during which an electric field is applied to the pinning layer 20. That is, it is preferable to satisfy the condition, Ts≤Tp. The rises and falls in the timing chart shown in FIG. 6 are sharp, but those rises and falls can be gentler depending on the circuit design. Also, in the timing chart, the applied voltage and the flowed shift current are constant with respect to time. However, the applied voltage and the flowed shift current can vary in terms of time, as long as the condition, Ts≤Tp, is satisfied.

(Write Unit)

Figure 7:
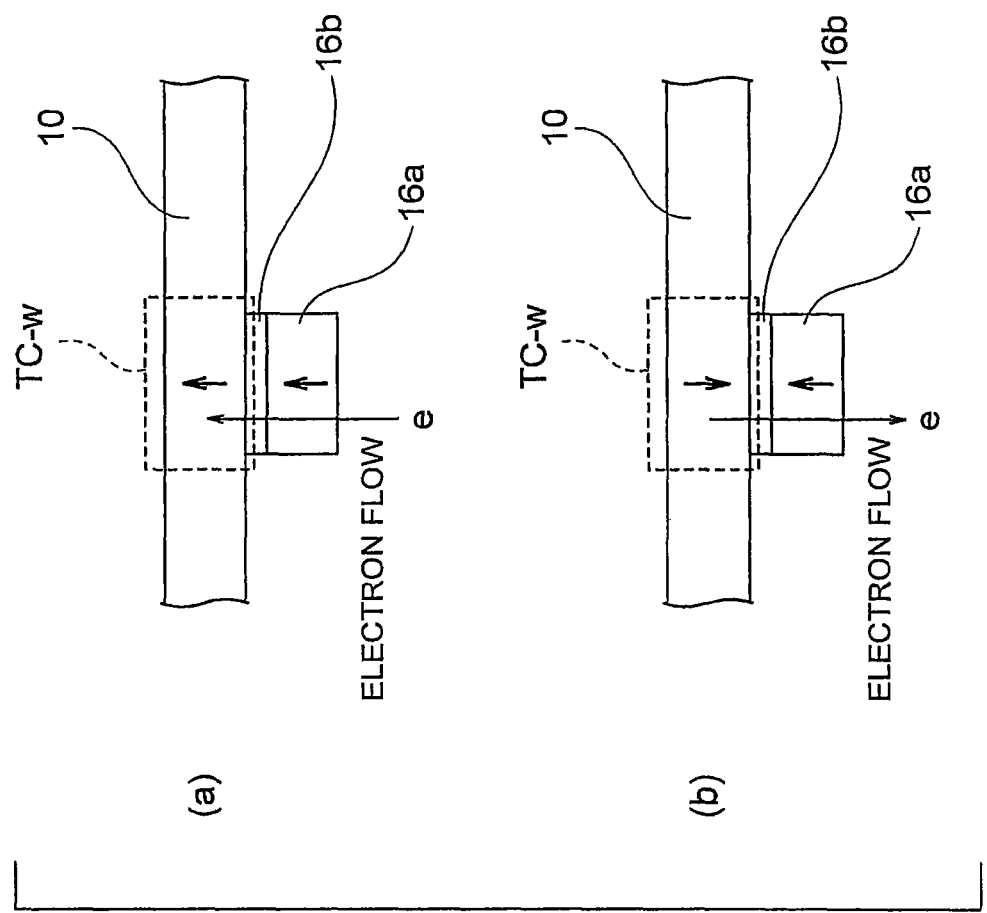
FIGS. 7(a) and 7(b) are diagrams for explaining a spin torque write method.

The write unit 16 is provided to a portion of the magnetic nanowire 10. Data is written by determining the magnetization direction of a corresponding target cell (the cell located at the address at which writing is to be performed: TC-w) in the magnetic nanowire 10. As shown in FIGS. 7(a) and 7(b), spin-transfer torque writing can be used by the write unit 16. In FIGS. 7(a) and 7(b), a magnetic electrode 16a is provided in contact with the magnetic nanowire 10 via an intermediate layer 16b. The intermediate layer 16b can be formed with a nonmagnetic metal layer, a nonmagnetic semiconductor layer, or a tunnel barrier layer.

The magnetization direction of the magnetic electrode 16a is perpendicular to the film plane of the intermediate layer 16b. It should be noted that the film plane means the interface between the intermediate layer 16b and the magnetic electrode 16a, and is a plane parallel to the extending direction of the magnetic nanowire 10. In a write operation, electrons are made to flow (in the opposite direction from the current flow) between the magnetic nanowire 10 and the magnetic electrode 16a, and data is written by determining the magnetization direction of the target cell TC-w from the direction of the electron flow. FIG. 7(a) shows a case where writing is performed so that the magnetization direction of the target cell TC-w becomes parallel to the magnetization direction of the magnetic electrode 16a. In this case, electrons flow into the target cell TC-w in the magnetic nanowire 10 from the magnetic electrode 16a via the intermediate layer 16b. FIG. 7(b) shows a case where writing is performed so that the magnetization direction of the target cell TC-w becomes antiparallel to the magnetization direction of the magnetic electrode 16a. In this case, electrons flow into the magnetic electrode 16a from the target cell TC-w in the magnetic nanowire 10 via the intermediate layer 16b.

The nonmagnetic metal layer serving as the intermediate layer 16b of the spin-transfer torque write unit 16 can be made of Cu, Ag, Au, Al, or an alloy containing at least one of those elements. The tunnel barrier layer serving as the intermediate layer 16b can be made of a material such as aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, or $Cr_2O_3$. Also, a nonmagnetic material such as graphite can be used as the material of the intermediate layer 16b.

As the material of the magnetic electrode 16a of the spin-transfer torque write unit 16, any of the materials mentioned as examples of the material of the magnetic nanowire 10 and the material of the magnetic phase(s) 24 of the pinning layer 20 can be used.

Figure 8:
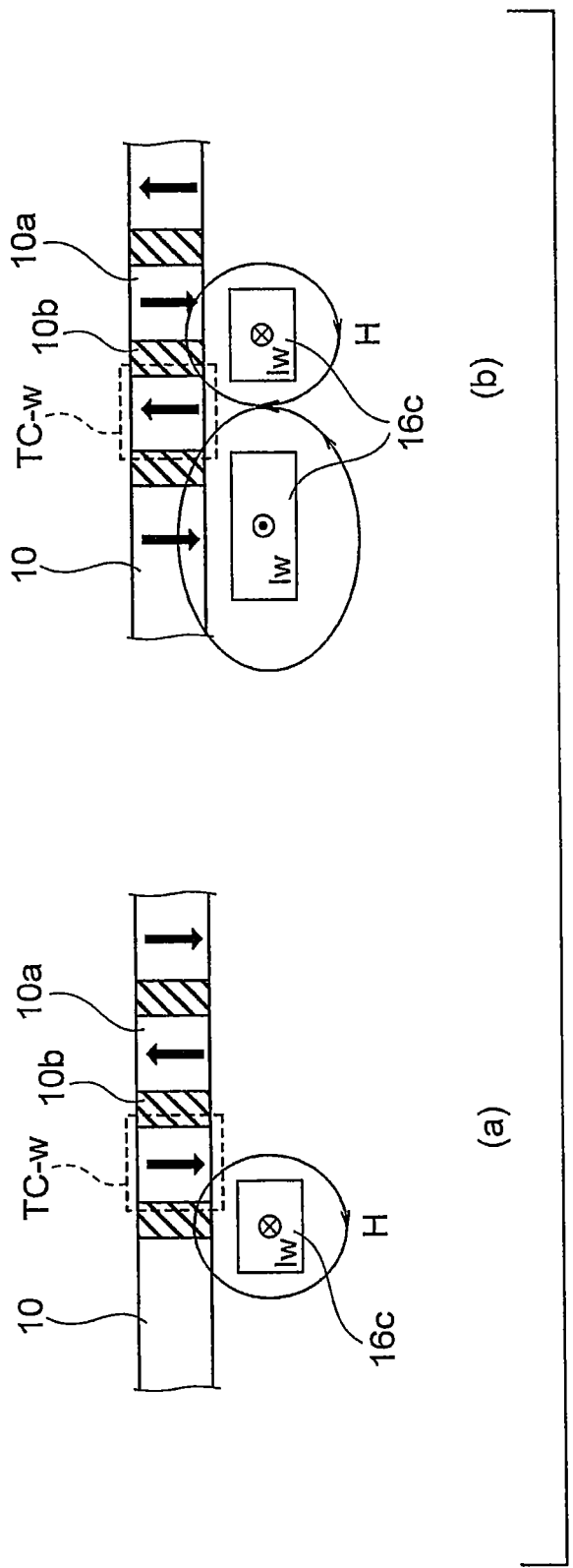
FIGS. 8(a) and 8(b) are diagrams for explaining write methods using a magnetic field generated by a current.

As shown in FIGS. 8(a) and 8(b), a write line formed with a metal wire 16c, for example, can be used for the write unit 16. The write line is positioned at a distance from the magnetic nanowire 10, and is perpendicular to the magnetic nanowire 10. In a write operation, a write current Iw is flowed to the write line 16c, and the magnetic field generated by the write current Iw is applied to the target cell TC-w located at one end portion of the magnetic nanowire 10. As a result, the magnetization direction of the target cell TC-w is determined, to write data. FIG. 8(a) shows a case where the write line is a single line. FIG. 8(b) shows a case where the write line is a folded wire, and the write current can be halved. Further, in the case illustrated in FIG. 8(b), the size of each target cell can be defined by the gap size of the folded wire, and accordingly, a machining dimension can be advantageously set as the cell size.

(Read Unit)

Figure 9:
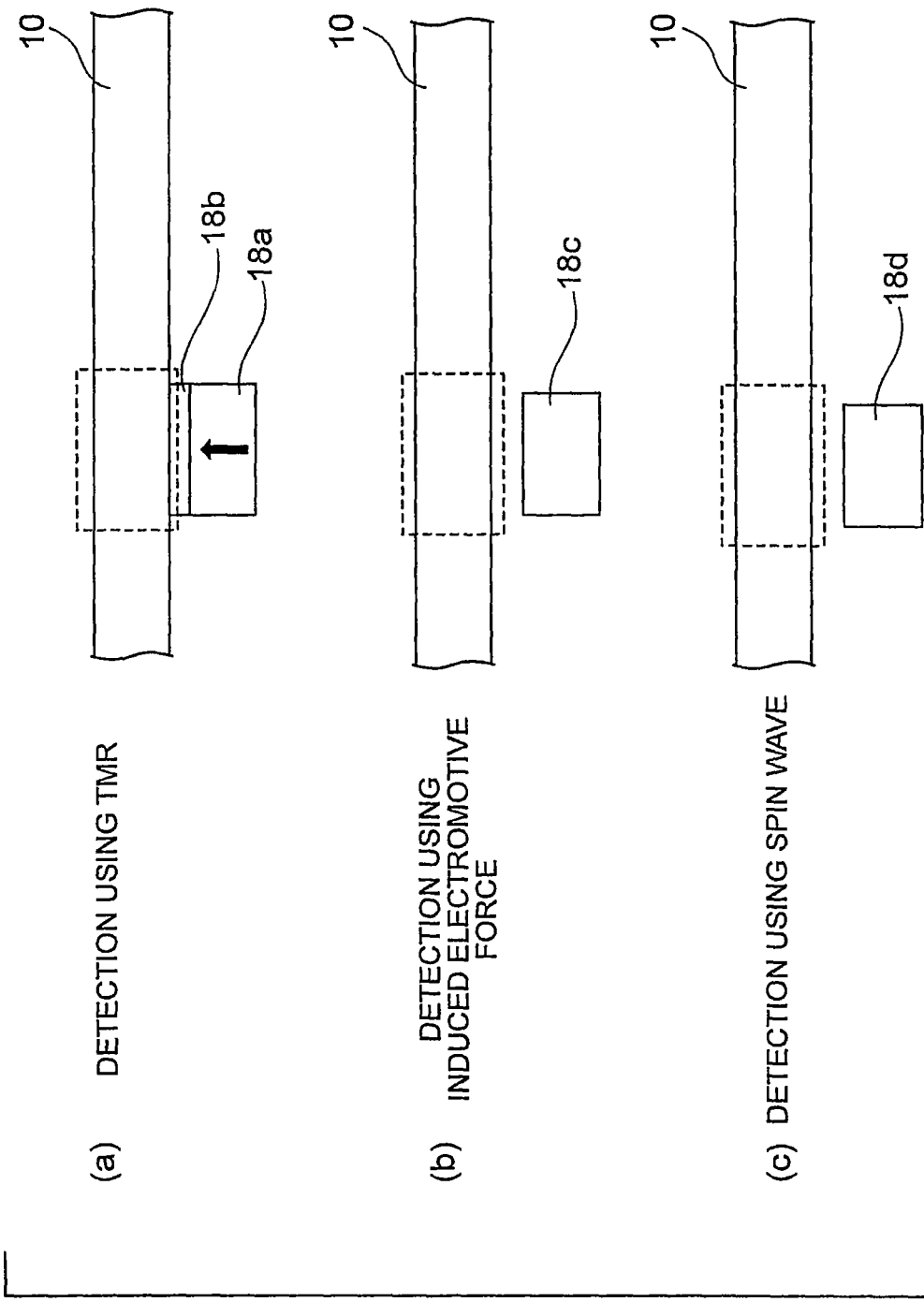
FIGS. 9(a) through 9(c) are diagrams for explaining read methods.

As shown in FIG. 1, the read unit 18 is further provided as a part of the magnetic nanowire 10. The magnetization direction of a target cell TC-w having shifted to a corresponding position in the magnetic nanowire 10 is read by the read unit 18. As shown in FIG. 9(a), the read unit 18 can have a structure in which a magnetic electrode 18a is provided in contact with the magnetic nanowire 10 via a tunnel barrier layer 18b, so as to read a signal as a tunnel magnetoresistive effect, for example. The tunnel barrier layer 18b can be made of a material such as aluminum oxide (AlOx), aluminum nitride (AlN), magnesium oxide (MgO), magnesium nitride, silicon oxide ($SiO_2$), silicon nitride (Si—N), silicon oxynitride (Si—O—N), $TiO_2$, or $Cr_2O_3$. The magnetic electrode 18a can be made of a material that is one of those mentioned as the material of the magnetic nanowire 10 and the material of the magnetic phase(s) 24 of the pinning layer 20.

As shown in FIG. 9(b), in the read unit 18, a detection line 18c can be provided at a distance from the magnetic nanowire 10, so that the magnetization direction of the target cell TC-w can be read by using the induced electromotive force generated in the detection line 18c when the domain walls 10b shift. Also, as shown in FIG. 9(c), a spin-wave transmission line 18d can be provided at a distance from or in contact with the magnetic nanowire 10, so that the magnetization direction of the target cell TC-w can be detected as a spin wave signal.

(Current Introducing Portions)

Figure 10:
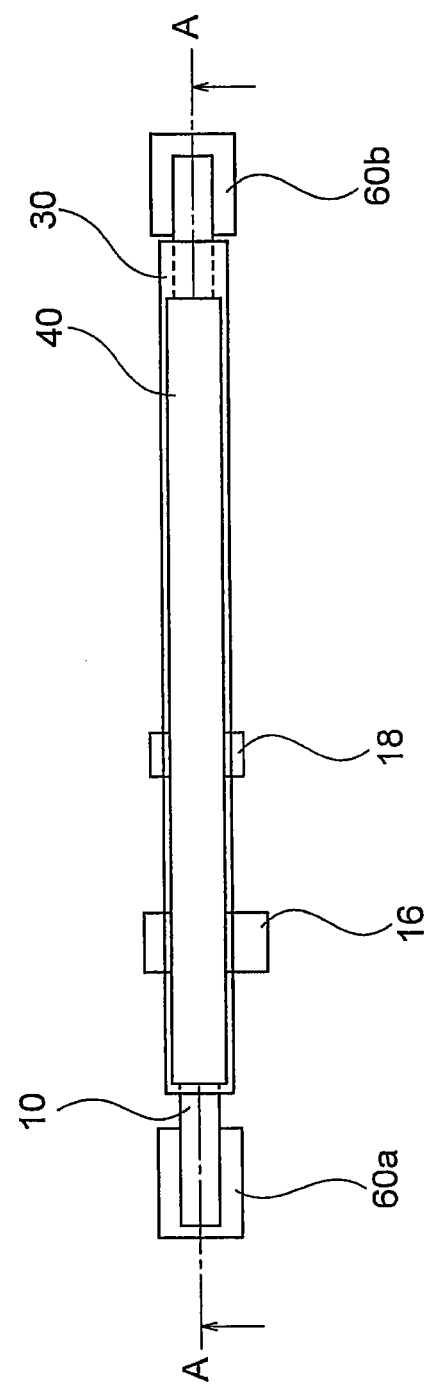
FIG. 10 is a top view of the magnetic memory according to a first embodiment.

As shown in FIG. 10, two current introducing portions 60a and 60b into which the shift current for moving the domain walls 10b formed in the magnetic nanowire 10 is introduced are further provided at portions of the magnetic nanowire 10. A current source (not shown) is connected to one (the current introducing portion 60a, for example) of the current introducing portions. The cross-section taken along the section line A-A defined in FIG. 10 is shown in FIG. 1.

The current Is supplied from the current source is flowed to the magnetic nanowire 10 via the current introducing portion 60a, to move the domain walls 10b. The shifting direction of the domain walls 10b is the opposite from the flowing direction of the current Is.

A write operation is performed by the shift current Is moving the target cell TC-w to the location corresponding to the write unit 16. At the time of reading, the domain walls 10b located in front of or behind the target cell TC-w are moved across the detection line 18, and reading is performed by the read unit 18.

As described above, the first embodiment can provide a magnetic memory that includes a magnetic nanowire with a domain wall pinning site (a pinning layer). Furthermore, an increase in current during a shift operation caused by an increase in the pinning force caused by the introduction of the pinning site can be restrained by controlling the pinning force through application of a voltage.

Second Embodiment

Figure 11:
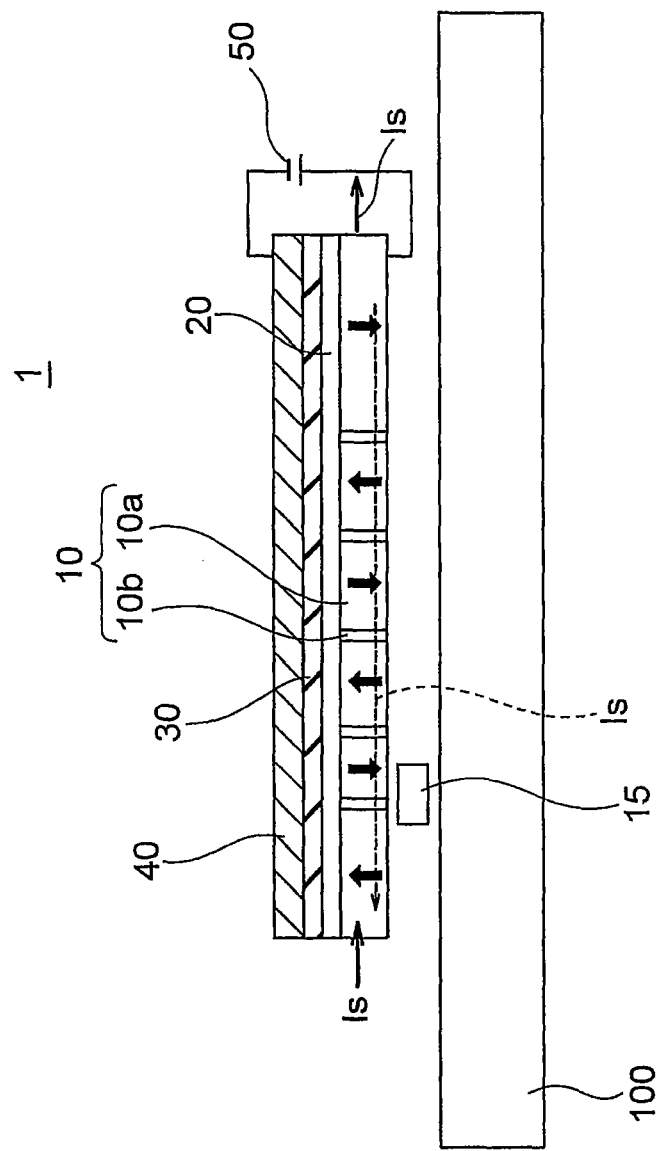
FIG. 11 is a cross-sectional view of a magnetic memory according to a second embodiment.

FIG. 11 shows a magnetic memory of a domain wall shift type according to a second embodiment. The magnetic memory 1 of the second embodiment is the same as the magnetic memory 1 of the first embodiment illustrated in FIG. 1, except that the write unit 16 and the read unit 18 are replaced with a write/read unit 15. This write/read unit 15 is formed by combining the write unit 16 and the read unit 18 of the first embodiment into one structure, and serves as both of those units.

The spin-transfer torque writing structure illustrated in FIGS. 7(a) and 7(b) and the TMR reading structure illustrated in FIG. 9(a) may be used so that the write/read unit 15 can serve as both the write unit and the read unit. Alternatively, the magnetic field writing generated by the current illustrated in FIGS. 8(a) and 8(b) and the reading using an induced electromotive force illustrated in FIG. 9(b) can be used so that the write/read unit 15 can serve as both the write unit and the read unit.

In the second embodiment, the write unit and the read unit are combined into one unit, and accordingly, the area to be involved in writing and reading can be made smaller. Thus, the memory capacity per chip can be increased.

Like the first embodiment, the second embodiment can provide a magnetic memory that includes a magnetic nanowire with a domain wall pinning site (a pinning layer). Furthermore, an increase in current during a shift operation caused by an increase in the pinning force caused by the introduction of the pinning site can be restrained by controlling the pinning force through application of a voltage.

Third Embodiment

Figure 12:
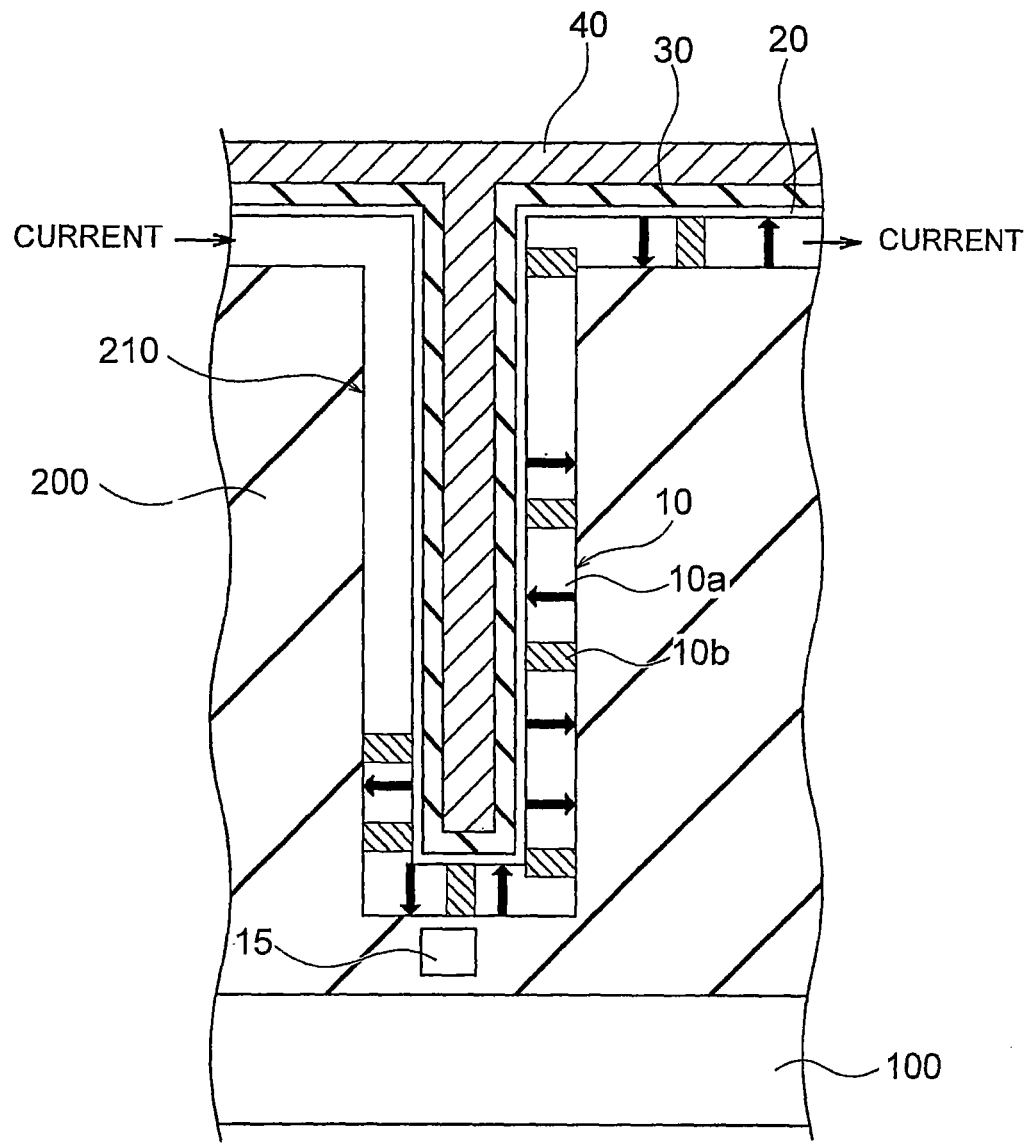
FIG. 12 is a cross-sectional view of a magnetic memory according to a third embodiment.

FIG. 12 shows a magnetic memory of a domain wall shifting type according to a third embodiment. FIG. 12 is a cross-sectional view of the magnetic memory of the third embodiment. The magnetic memory of the third embodiment has a structure in which a trench (also called a hole) 210 is formed in an interlayer insulating film 200 placed on a substrate 100 having an integrated circuit (not shown) mounted thereon, and the magnetic nanowire 10, the pinning layer 20, the insulating layer 30, and the electrode layer 40 of the first embodiment are stacked in this order on the side surfaces and the bottom surface of the trench 210. That is, each of the magnetic nanowire 10, the pinning layer 20, and the insulating layer 30 is formed into a U-like shape in the trench 210. The region in the trench 210 on the opposite side of the insulating layer 30 from the pinning layer 20 is filled with the electrode layer 40. Also, a structure formed by stacking the magnetic nanowire 10, the pinning layer 20, the insulating layer 30, and the electrode layer 40 in this order is provided on the upper surface of the interlayer insulating film 200, and this structure is connected to each of the magnetic nanowire 10, the pinning layer 20, the insulating layer 30, and the electrode layer 40 formed in the trench 210.

Accordingly, the electrode layer 30 is T-shaped, as shown in FIG. 12. A write/read unit 15 is provided in a portion of the interlayer insulating film 200 located between the bottom surface of the trench 210 and the substrate 100. That is, the magnetic memory of the third embodiment greatly differs from the magnetic memories of the first and second embodiments in that the magnetic nanowire 10 is located perpendicularly to the substrate 100.

Taking into account that the read unit and the write unit are connected to the integrated circuit (not shown) in the substrate 100, the read unit and the write unit are preferably located on a side of the substrate 100 and on a side of the magnetic nanowire 10. Although the write/read unit 15 serving as both the write unit and the read unit is provided in the third embodiment illustrated in FIG. 12, the write unit and the read unit can be provided independently of each other in the vertical type as in the horizontal type illustrated in FIG. 1. Where the read unit and the write unit are independent of each other, the respective operation margins can be more easily secured.

The third embodiment can achieve the same effects as those of the first and second embodiments. Furthermore, the magnetic nanowire 10 is U-shaped in the third embodiment. Accordingly, the cell area in the horizontal direction can be made smaller, and a larger capacity can be achieved through an increase in density. Whether the magnetic nanowire 10 is U-shaped or V-shaped with an open top portion, the same effect of the pinning layer can be achieved.

Next, Examples are described.

Example 1

To examine the functions of a pinning layer 20, simulations based on micromagnetics were performed. Referring now to FIGS. 13(a) through 13(d), the results of those simulations are described.

Figure 13:
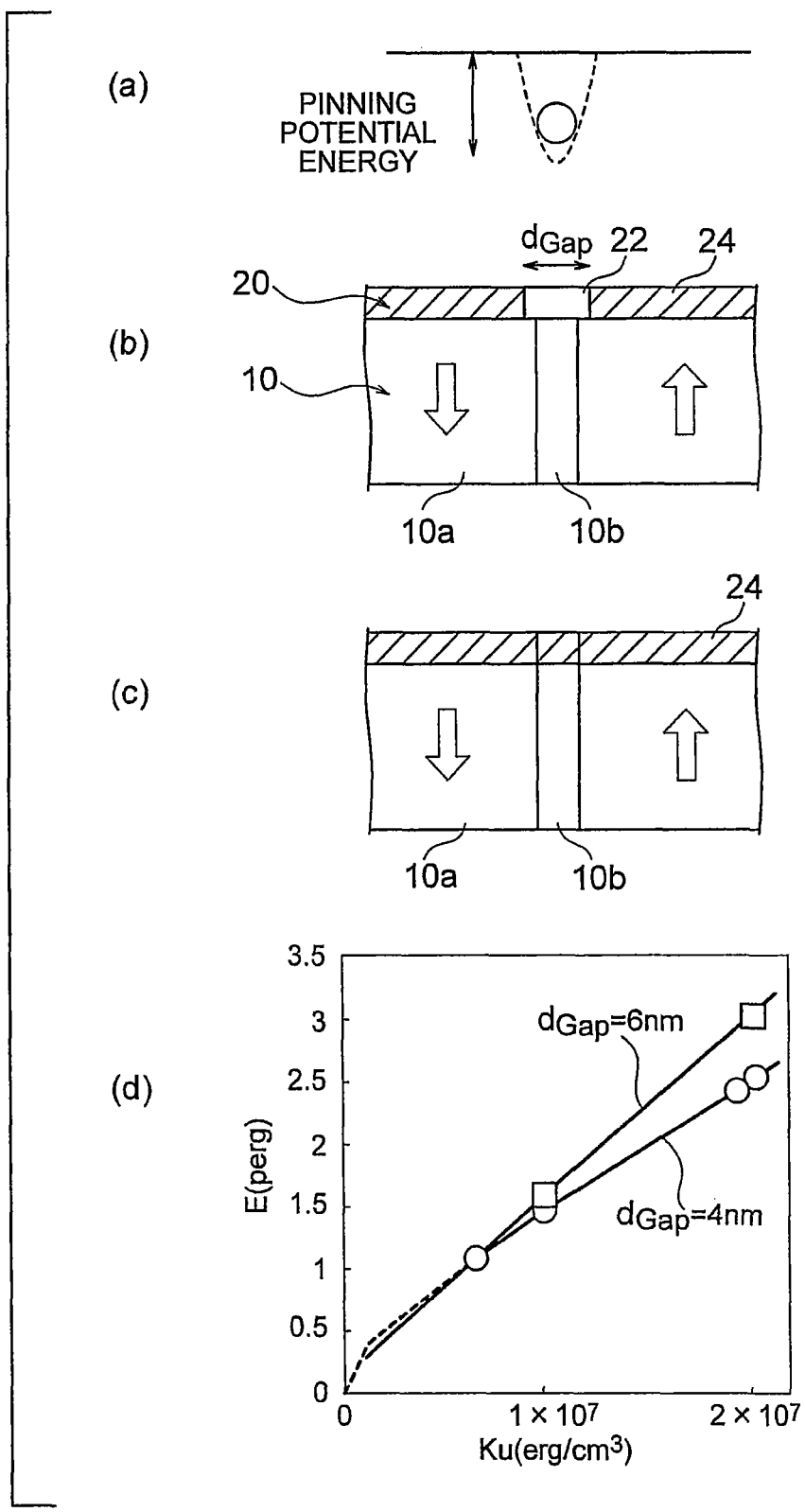
FIGS. 13(a) through 13(d) are diagrams for explaining the pinning potential generated from the pinning layer.

First, a pinning layer 20 having a thickness of 1 nm is formed on a magnetic nanowire 10 that had a width of 20 nm, a thickness of 5 nm, and a saturation magnetization of 200 emu/cm$^3$. The domain wall energy in a case where nonmagnetic phases 22 exists in the pinning layer 20 (FIG. 13(b)) is determined, and the domain wall energy in a case where nonmagnetic phases 22 did not exist in the pinning layer 20 (FIG. 13(c)) is also determined. The pinning potential energy shown in FIG. 13(a) is determined from the difference between those domain wall energies. Pinning potential energies are determined in cases where the length $d_{Gap}$ of the nonmagnetic phases 22 in the pinning layer 20 is 4 nm and 6 nm. The pinning potential energies determined in this manner are shown in FIG. 13(d). In FIG. 13(d), the abscissa axis indicates the magnetic anisotropy energy Ku of the magnetic phases 24 of each pinning layer 20, and the ordinate axis indicates the pinning potential energy. As shown in FIG. 13(d), the pinning potential energy depends on the intensity of the magnetic anisotropy energy Ku of the magnetic phases 24. As the pinning potential energy becomes larger, the domain walls 10b are more strongly pinned. It became apparent that, since about 2.5 pico-erg is equivalent to 60 kT (k representing Boltzmann constant, T representing room temperature), thermal fluctuation resistance as high as that of a HDD (Hard Disk Drive) can be achieved by appropriately choosing the magnetic anisotropy energy Ku, though the pinning layer 20 is as thin as 1 nm. Also, the pinning force becomes smaller as the magnetic anisotropy energy Ku becomes smaller.

The magnetic anisotropy energy Ku is then varied from $1.7 \times 10^7$ erg/cm$^3$ to $1.3 \times 10^7$ erg/cm$^3$ by applying an electric field to the pinning layer 20, and the current values required for moving the domain walls 10b in the respective cases are determined. As a result, the current value required for a shift operation is reduced almost by half. Thus, it is confirmed that application of an electric field to the pinning layer 20 has the effect to reduce the current value required for a shift operation.

Example 2

Figure 14:
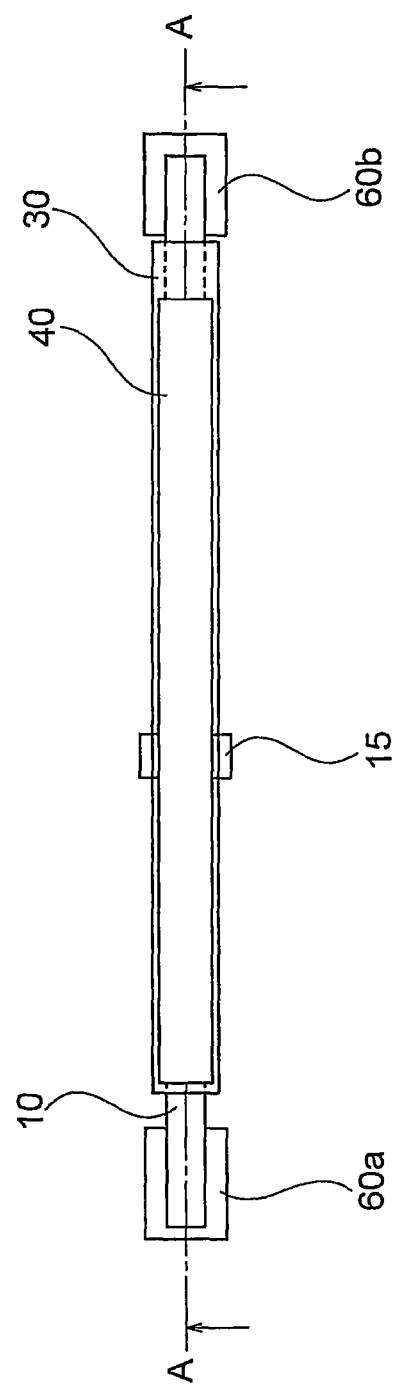
FIG. 14 is a top view of a magnetic memory according to Example 1.
Figure 15:
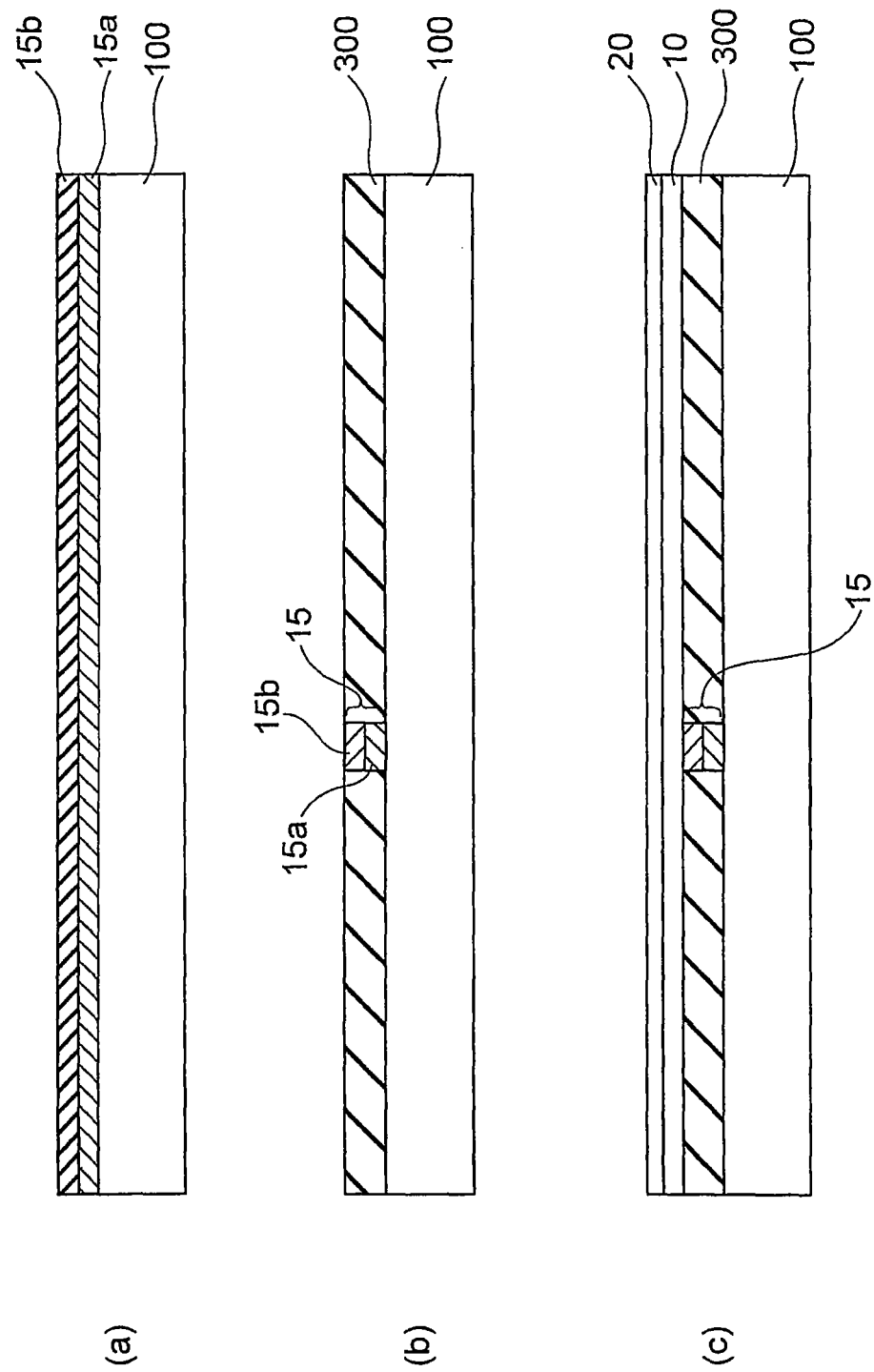
FIGS. 15(a) through 15(c) are cross-sectional views illustrating procedures for manufacturing the magnetic memory according to Example 1.
Figure 16:
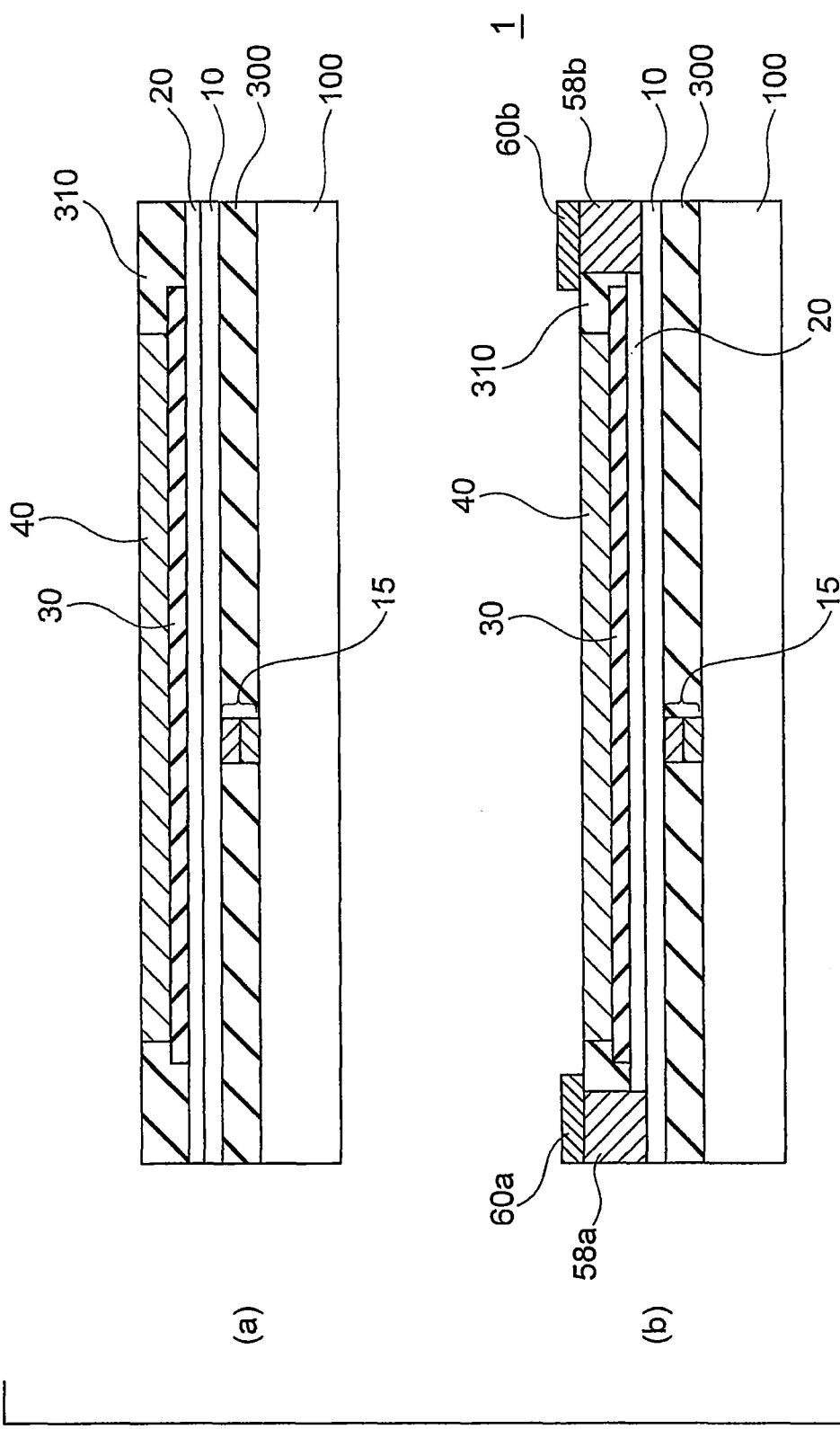
FIGS. 16(a) and 16(b) are cross-sectional views illustrating procedures for manufacturing the magnetic memory according to Example 1.
Figure 17:
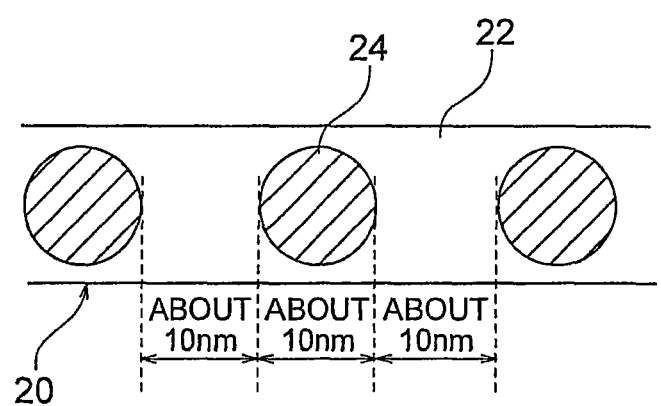
FIG. 17 is a top view of the pinning layer formed according to Example 2.
Figure 18:
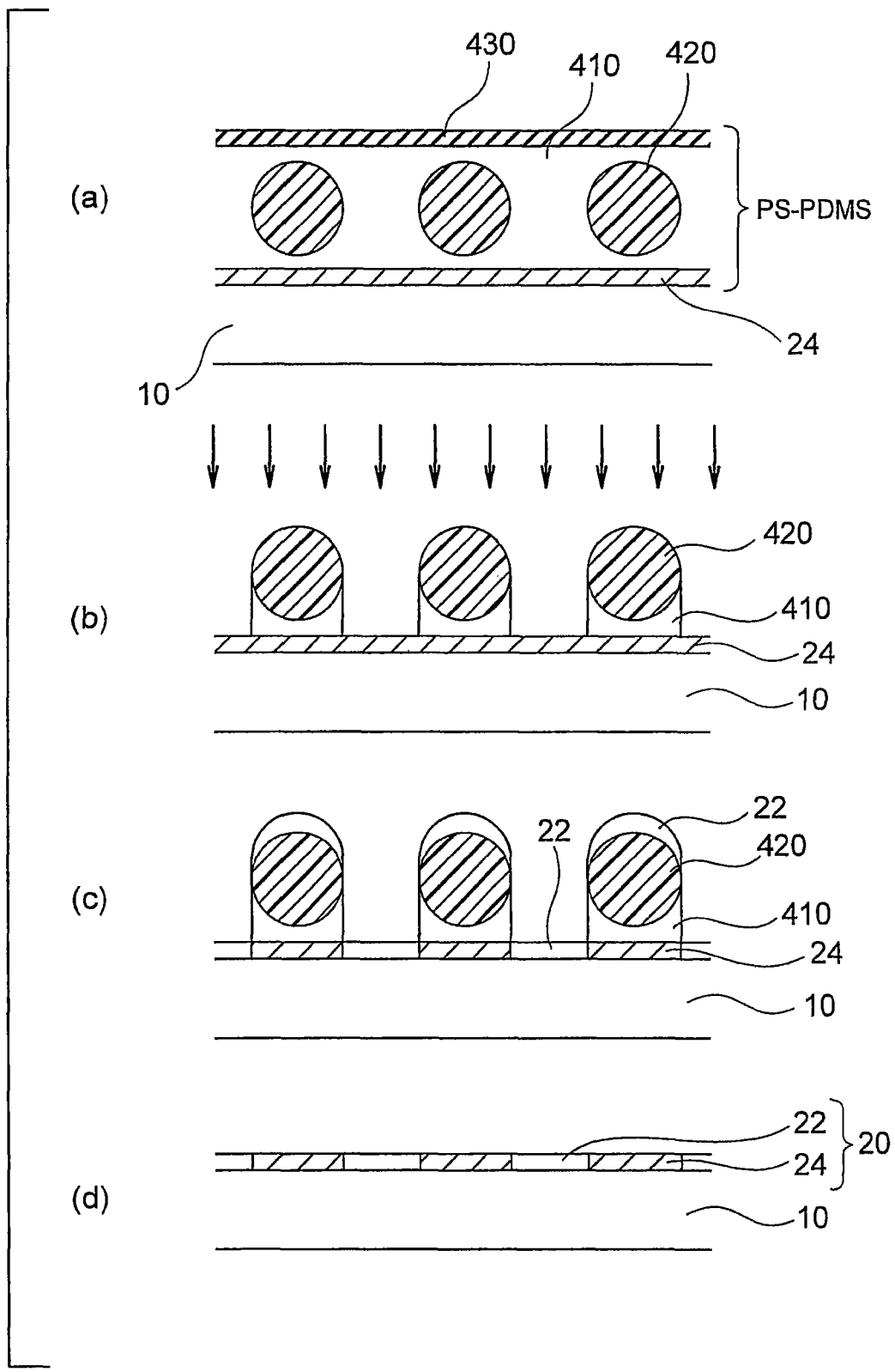
FIGS. 18(a) through 18(d) are cross-sectional views illustrating the procedures for manufacturing the pinning layer of Example 2.

Referring now to FIGS. 14 through 18(d), a method of manufacturing the magnetic memory of the second embodiment is described as Example 2. FIG. 14 is a top view of the magnetic memory of this example. Spin-transfer torque writing and TMR reading are used, and the write unit and the read unit are combined into a write/read unit 15. The width of a magnetic nanowire 10 is 20 nm. FIGS. 15(a) through 16(b) are cross-sectional views illustrating the procedures for manufacturing the magnetic memory of this example, taken along the section line A-A defined in FIG. 14. A pinning layer 20 has the structure illustrated in FIG. 2(c). FIG. 17 is a top view of the pinning layer 20. As shown in FIG. 17, in this pinning layer 20, the dot diameter was approximately 10 nm, and the dot pitch is 10 nm, so that the size of each 1 bit to be recorded in the magnetic nanowire 10 became 20 nm. FIGS. 18(a) through 18(d) are cross-sectional views illustrating the procedures for manufacturing the pinning layer 20 used in this example.

First, a substrate 100 having the pattern of lower electrode lines for reading/writing (not shown) formed beforehand thereon is prepared, and is placed in an ultrahigh vacuum sputtering apparatus. TbCoFe (30 nm)/CoFeB (2 nm) is then formed as a magnetic electrode 15a equivalent to a TMR pinning layer on the substrate 100 via a buffer layer. The numeric values in the parentheses indicate film thicknesses. Further, an insulating layer 15b made of MgO (1 nm) is formed on the CoFeB layer (FIG. 15(a)).

A resist (not shown) is then applied, and a resist mask is formed from the resist by using a lithography technique. Ion milling is performed by using this resist mask, to process the magnetic electrode 15a and the insulating layer 15b into shapes of approximately 20 nm×20 nm, and form the write/read unit 15. After that, the region surrounding the write/read unit 15 is filled with an insulator such a $SiO_2$ film 300, for example, and the resist mask is removed (FIG. 15(b)).

The substrate 100 is again put into the ultrahigh vacuum sputtering apparatus, and CoFeB (1 nm)/TbFeCo (10 nm) is formed as a magnetic nanowire material. A magnetic phase to form a pinning layer is further formed on the magnetic nanowire material. The magnetic phase is then processed by the later described DSA technique, to form the pinning layer 20 (FIG. 15(c)). Until this procedure, the magnetic nanowire 10 and the pinning layer 20 may not be in a nanowire state, and may remain simple solid films.

A resist (not shown) is then applied onto the pinning layer 20, and the resist is exposed and developed in a nanowire state by using an EB lithography apparatus, to form a nanowire resist mask. By using this nanowire mask, ion milling is performed to process the magnetic nanowire 10 and the pinning layer 20 into nanowire forms. The nanowire mask formed on the pinning layer 20 is then removed, to complete the magnetic nanowire 10 with the pinning layer 20 located adjacent thereto.

An insulating layer 30 made of HfO is then formed. A resist (not shown) is applied, and the resist is exposed and developed by using an EB lithography apparatus, to form a mask corresponding to the insulating layer 30. By using this mask, ion milling is performed to pattern the insulating layer 30. The mask formed on the insulating layer 30 is then removed. An electrode layer material formed with Ta/Au is then formed. A resist (not shown) is applied onto the electrode layer material film, and the resist is exposed and developed by using the EB lithography apparatus, to form a mask. By using this mask, ion milling is performed to form an electrode layer 40 for applying an electric field to the pinning layer 20. A nonmagnetic insulating layer is then formed, and the mask formed on the electrode layer 40 is removed. In this manner, the region surrounding the electrode layer 40 is filled with a nonmagnetic insulating layer 310 (FIG. 16(a)).

A resist mask (not shown) covering the electrode layer 40 is then formed by using a lithography technique. By using this resist mask, ion milling is performed to pattern the nonmagnetic insulating layer 310, to form openings that reach the upper surface of the magnetic nanowire 10. After that, the openings are filled with a metal, to form current introducing vias 58a and 58b connecting to the magnetic nanowire 10. A metal film is then formed, and patterning is performed on the metal film, to form current introducing portions 60a and 60b connecting to the current introducing vias 58a and 58b, respectively.

In the above manner, the magnetic memory 1 that includes the pinning layer 20 and uses the magnetic nanowire 10 can be manufactured.

Referring now to FIGS. 18(a) through 18(d), formation of the pinning layer 20 having the magnetic phases 24 formed with dots pitched at 20 nm as shown in FIG. 17 is described. This pinning layer 20 is formed by a DSA technique using polystyrene-polydimethylsiloxane (PS-PDMS).

First, a guide (not shown) formed from a resist having grooves parallel to the magnetic nanowire 10 is formed on a magnetic layer 24 by using electron beam lithography. A PS-PDMS solution is then applied to the grooves. As the PS-PDMS solution to achieve dots pitched at 20 nm, a PS-PDMS solution with a PS molecular weight of 12,000 and a PDMS molecular weight of approximately 3,000 is used. A thermal treatment is then performed at 180° C., to cause a microphase separation in the PS-PDMS. As a result, PDMS dots 420 are cyclically formed in the PS matrix 410, and a PDMS thin layer 430 is formed on the surface layer of the PS matrix 410 as shown in FIG. 18(a). The thin layer 430 is removed by $CF_4$ plasma etching, and etching is further performed through an $O_2$ plasma etching process until the magnetic phase 24 surfaces. As a result, a mask having the PDMS 420 dots left as a convex pattern is formed (FIG. 18(b)). By using this mask 420, etching is performed on the extremely thin magnetic phase 24, and a MgO film to be a nonmagnetic phase 22 is further deposited (FIG. 18(c)). After that, the mask portions are removed by $CF_4$ plasma etching and a wet process (FIG. 18(d)). In this manner, the pinning layer 20 can be formed.

Example 3

Figure 19:
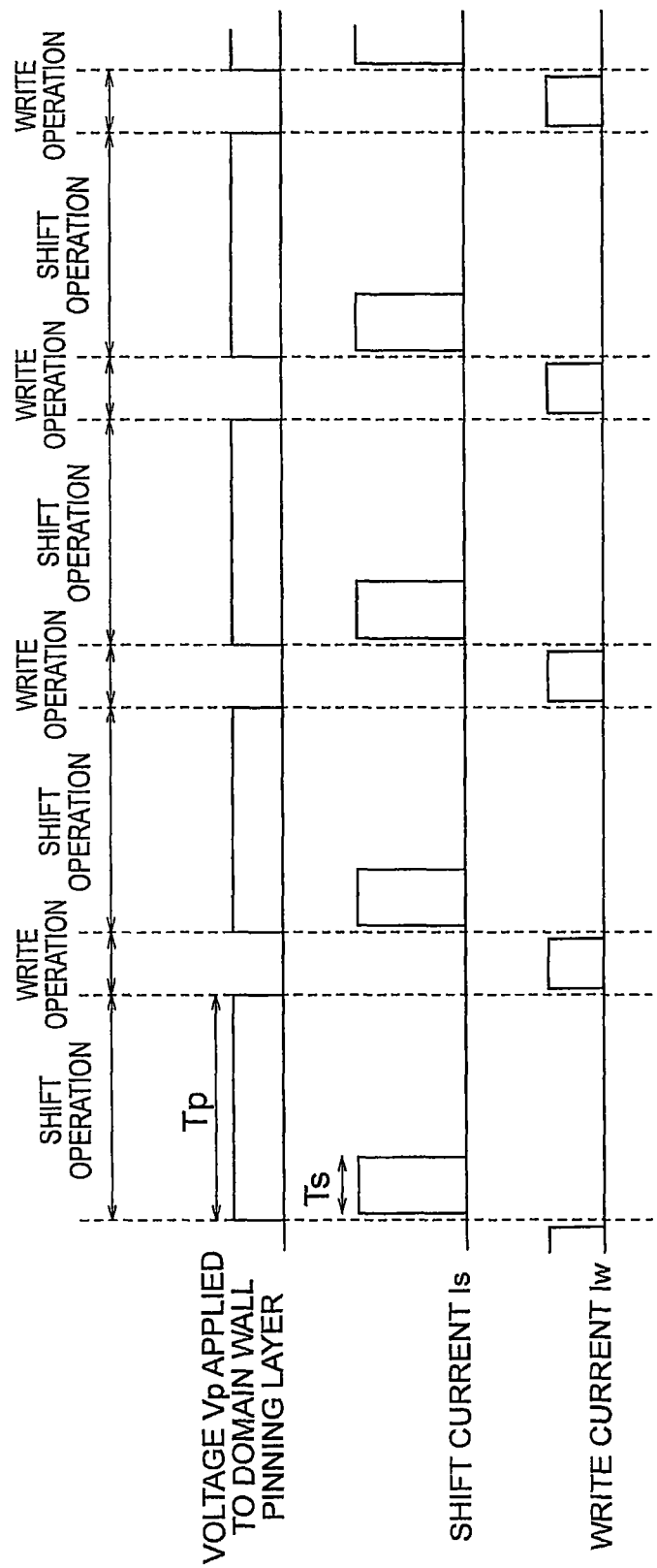
FIG. 19 is a diagram showing an example of a timing chart using a spin torque write method.
Figure 20:
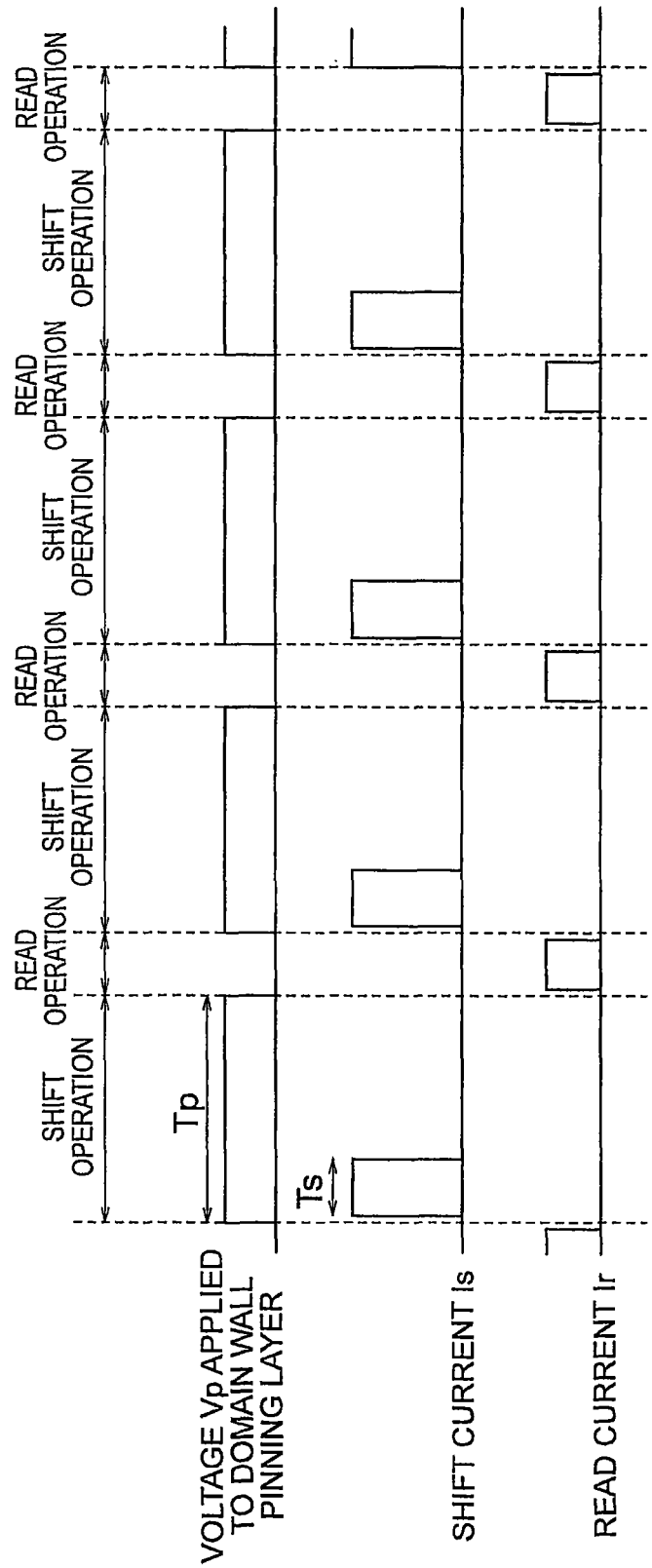
FIG. 20 is a diagram showing an example of a timing chart using a TMR read method.

Referring now to FIGS. 19 and 20, respective timings to write data into a magnetic nanowire having a pinning layer attached thereto with spin torque, and to read data by a TMR read method are described as Example 3. This operation method can be applied to any of the first through third embodiments.

(Writing)

FIG. 19 shows an example of a timing chart obtained when spin-transfer torque writing is performed. First, a shift operation is performed. An electric field Vp is applied to a pinning layer 20, to weaken the pinning force. A shift current Is is flowed to a magnetic nanowire 10, to move domain walls 10b. The shift current Is is flowed while the voltage Vp is being applied to the pinning layer 20. The time duration Ts of flowing a current to the magnetic nanowire 10 preferably satisfies the relationship, Ts≤Tp, with respect to the time duration Tp of application of the voltage Vp.

In the example illustrated in FIG. 19, writing is performed when the voltage Vp is zero. This method is particularly effective in a case where spin-transfer torque writing is performed by using the magnetic nanowire 10 also as the path of a write current Iw at the time of recording. In that case, one of the electrodes for applying a current to a TMR read unit is provided below the magnetic electrode 16a shown in FIGS. 7(a) and 7(b), and the other one of the electrodes is provided in the electrode (one of the current introducing portions 60a and 60b shown in FIG. 10, for example) for flowing a current to the magnetic nanowire 10. This structure contributes to a decrease of the number of electrodes required for TMR measurement, and accordingly, is desirable in achieving a higher memory density. However, a current is also flowed to the magnetic nanowire 10 at the time of writing, and there is a possibility that the domain walls 10b are made to shift by the current. To counter this problem, the voltage to be applied to the pinning layer 20 is made zero at the timing of writing, to achieve a pinning effect. In this manner, unexpected domain wall shifts by the write current can be effectively prevented. In other words, the current margin required for the write current and the shift operation current can be effectively reduced.

If the magnetic nanowire 10 does not serve as the path of the write current Iw, the electric field can continue to be applied to the pinning layer 20 throughout a sequence of shift operations and write operations.

Although a shift operation is performed before the start of a write operation in the above description, it is possible to perform a write operation, a shift operation, a write operation, and a shift operation in this order.

(Reading)

FIG. 20 is a timing chart of TMR reading. First, a shift operation is performed.

The electric field Vp is applied to the pinning layer 20, to weaken the pinning force. The shift current Is is flowed to the magnetic nanowire 10, to move the domain walls 10b. The shift current Is is flowed while the voltage Vp is being applied to the pinning layer 20. The time duration Ts of flowing a current to the magnetic nanowire 10 preferably satisfies the relationship, Ts≤Tp, with respect to the time duration Tp of application of the voltage Vp.

In the example illustrated in FIG. 20, a read operation is performed when the voltage Vp is zero. This method is particularly effective in a case where TMR reading is performed by using the magnetic nanowire 10 also as the current path of the read current Ir at the time of reading. Unexpected domain wall shifts by the read current can be prevented through the pinning by the pinning layer 20.

If the magnetic nanowire 10 does not serve as the current path of the read current Ir in TMR reproduction, or in a case of spin wave reproduction, the electric field can continue to be applied to the pinning layer 20 throughout a sequence of shift operations and read operations.

Although a shift operation is performed before the start of a read operation in the above description, it is possible to perform a read operation, a shift operation, and a read operation in this order.

The rises and falls in the timing charts shown in FIGS. 19 and 20 are sharp, but those rises and falls can become gentler depending on the circuit design. Also, in the timing chart, the applied voltage and the flowed currents are constant with respect to time. However, advantageous effects can be achieved even if the applied voltage and the flowed currents vary, as long as the above described condition is satisfied.

While certain embodiments have been described, these embodiments have been presented by way of example only, and are not intended to limit the scope of the inventions. Indeed, the novel methods and systems described herein can be embodied in a variety of other forms; furthermore, various omissions, substitutions and changes in the form of the methods and systems described herein can be made without departing from the spirit of the inventions. The accompanying claims and their equivalents are intended to cover such forms or modifications as would fall within the scope and spirit of the inventions.

What is claimed is:

1. A magnetic memory comprising:
a magnetic layer including a plurality of magnetic domains and a plurality of domain walls separating the magnetic domains from one another, the magnetic layer extending in a direction;
a pinning layer formed with nonmagnetic phases and magnetic phases, the pinning layer extending in an extending direction of the magnetic layer and being located adjacent to the magnetic layer;
an electrode layer located on the opposite side of the pinning layer from the magnetic layer;
an insulating layer located between the pinning layer and the electrode layer;
a current introducing unit configured to flow a shift current to the magnetic layer, the shift current causing the domain walls to shift;
a write unit configured to write information into the magnetic layer;
a read unit configured to read information from the magnetic layer; and
a voltage generating unit configured to generate a voltage to be applied between the pinning layer and the electrode layer.

2. The memory according to claim 1, wherein
the magnetic layer is formed on a substrate having an integrated circuit mounted thereon, and
the pinning layer is located on the opposite side of the magnetic layer from the substrate.

3. The memory according to claim 1, wherein a thickness of the pinning layer is greater than 0 nm and not greater than 10 nm.

4. The memory according to claim 1, wherein the pinning layer has a structure in which one of the magnetic phases and one of the nonmagnetic phases are alternately arranged in the extending direction of the magnetic layer.

5. The memory according to claim 1, wherein the pinning layer has a striped structure in which one of the magnetic phases and one of the nonmagnetic phases are alternately arranged in the extending direction of the magnetic layer.

6. The memory according to claim 1, wherein the pinning layer has a structure in which plural ones of the magnetic phases are arranged in one of the nonmagnetic phases in the extending direction of the magnetic layer.

7. The memory according to claim 1, wherein in the pinning layer, a length multiple times longer than a distance between adjacent ones of the nonmagnetic phases in the extending direction of the magnetic layer is equal to a length of one memory bit, the adjacent ones of the nonmagnetic phases sandwiching one magnetic phase.

8. The memory according to claim 1, wherein in the pinning layer, a distance between adjacent ones of the nonmagnetic phases in the extending direction of the magnetic layer is equal to a length of one memory bit, the adjacent ones of the nonmagnetic phases sandwiching one magnetic phase.

9. The memory according to claim 1, wherein the pinning layer has a granular structure in which one of the magnetic phases and the nonmagnetic phases is precipitated into the other one of the magnetic phases and the nonmagnetic phases.

10. The memory according to claim 1, wherein at least one nonmagnetic phase is formed with an insulator.

11. The memory according to claim 1, wherein at least one nonmagnetic phase is formed with a conductor.

12. The memory according to claim 1, wherein the write unit and the read unit are combined into one, and have the same structure.

13. The memory according to claim 1, wherein the shift current is flowed to the magnetic layer from the current introducing unit while the voltage generating unit is applying the voltage between the pinning layer and the electrode layer.

* * * * *